United States Patent
Lee et al.

(10) Patent No.: US 11,735,248 B2
(45) Date of Patent: Aug. 22, 2023

(54) SUB-WORD-LINE DRIVERS AND SEMICONDUCTOR MEMORY DEVICES INCLUDING THE SAME

(71) Applicant: Samsung Electronics Co., Ltd., Suwon-si (KR)

(72) Inventors: Seokjae Lee, Gwangmyeong-si (KR);
Bok-Yeon Won, Namyangju-si (KR);
Kyoungmin Kim, Namyangju-si (KR);
Donggeon Kim, Suwon-si (KR);
Myeongsik Ryu, Anyang-si (KR);
Sangwook Park, Hwaseong-si (KR);
Inseok Baek, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/685,849

(22) Filed: Mar. 3, 2022

(65) Prior Publication Data

US 2022/0406360 A1 Dec. 22, 2022

(30) Foreign Application Priority Data

Jun. 22, 2021 (KR) .................. 10-2021-0080765

(51) Int. Cl.
*G11C 11/408* (2006.01)
*H10B 12/00* (2023.01)

(52) U.S. Cl.
CPC .......... *G11C 11/4085* (2013.01); *H10B 12/50* (2023.02); *H10B 12/315* (2023.02); *H10B 12/34* (2023.02)

(58) Field of Classification Search
CPC ....... G11C 11/4085; G11C 5/025; G11C 8/14; G11C 8/08; G11C 5/063; H10B 12/50; H10B 12/315; H10B 12/34; H10B 12/488; H01L 27/0207
USPC ..................................... 365/189.05, 230.06
See application file for complete search history.

(56) References Cited

U.S. PATENT DOCUMENTS

| | | | |
|---|---|---|---|
| 6,222,789 B1 | 4/2001 | Cha | |
| 7,075,852 B2 | 7/2006 | Dono et al. | |
| 7,388,774 B1* | 6/2008 | Kim | .............. G11C 11/413 365/207 |
| 8,358,535 B2 | 1/2013 | Chae et al. | |
| 8,953,407 B2 | 2/2015 | Yun et al. | |

(Continued)

FOREIGN PATENT DOCUMENTS

| | | |
|---|---|---|
| KR | 20060131334 A | 12/2006 |
| TW | I559302 B | 11/2016 |
| TW | I588842 B | 6/2017 |

*Primary Examiner* — Michael T Tran
(74) *Attorney, Agent, or Firm* — Myers Bigel, P.A.

(57) ABSTRACT

A sub-word-line driver and semiconductor memory devices including the same are provided. The sub-word-line driver may include a word line pull-up transistor, a word line pull-down transistor, and a keeping transistor configured to maintain a word line at a specified voltage level. The sub-word-line driver may include a peripheral active region on a substrate, a first peripheral gate electrode that corresponds to a gate node of the word line pull-down transistor on the peripheral active region, a second peripheral gate electrode that corresponds to a gate node of the keeping transistor on the peripheral active region, and a first lower contact coupled to a first region of the peripheral active region. A first (VBB) voltage from the first region may be supplied to a source node of the keeping transistor.

20 Claims, 27 Drawing Sheets

(56) References Cited

U.S. PATENT DOCUMENTS

| | | |
|---|---|---|
| 9,082,467 B2 | 7/2015 | Yun et al. |
| 10,862,463 B1 * | 12/2020 | Zhou ................ H03K 3/356182 |
| 10,892,004 B2 | 1/2021 | Jeong |
| 2009/0261792 A1 * | 10/2009 | Kim .................... G11C 11/4074 |
| | | 323/282 |
| 2016/0142051 A1 * | 5/2016 | Chan .................. H03K 17/6872 |
| | | 327/108 |
| 2019/0189186 A1 | 6/2019 | Won et al. |

* cited by examiner

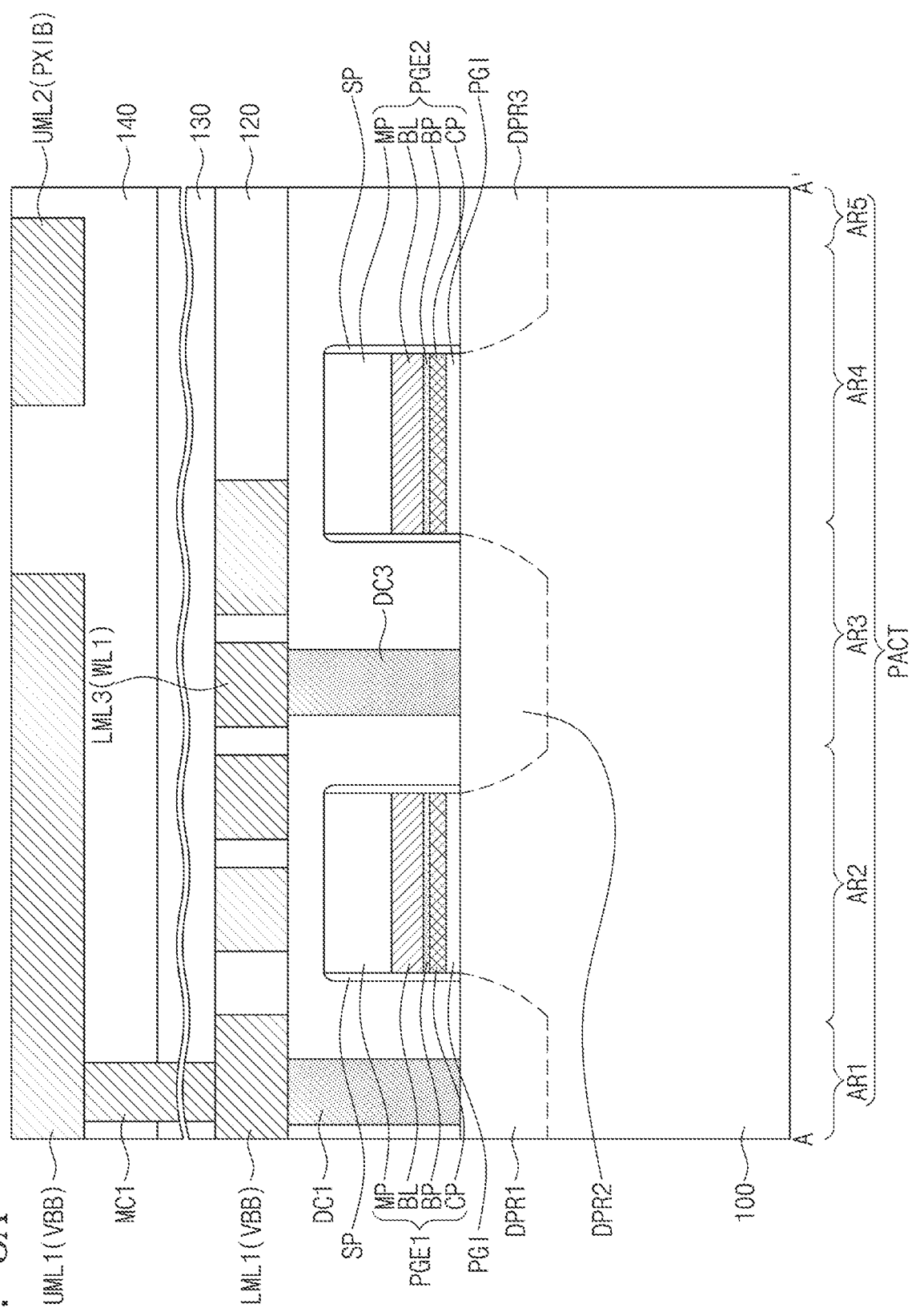

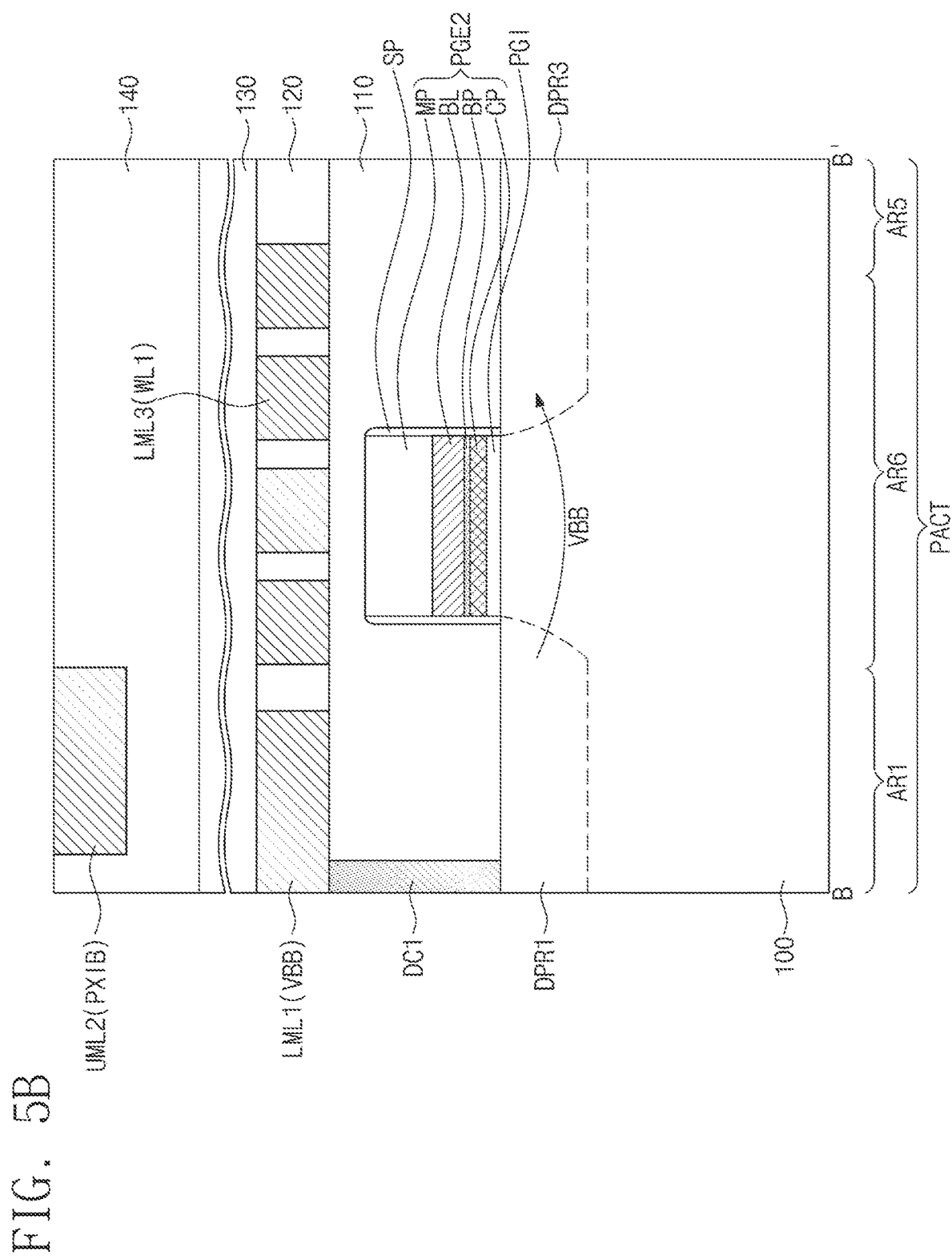

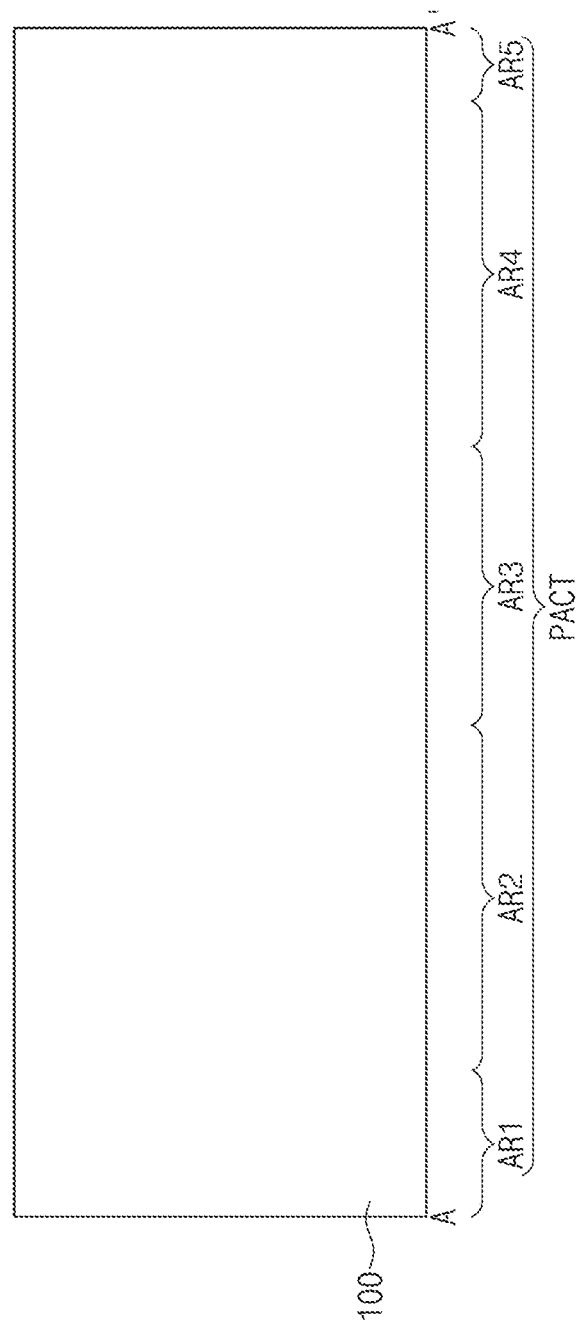

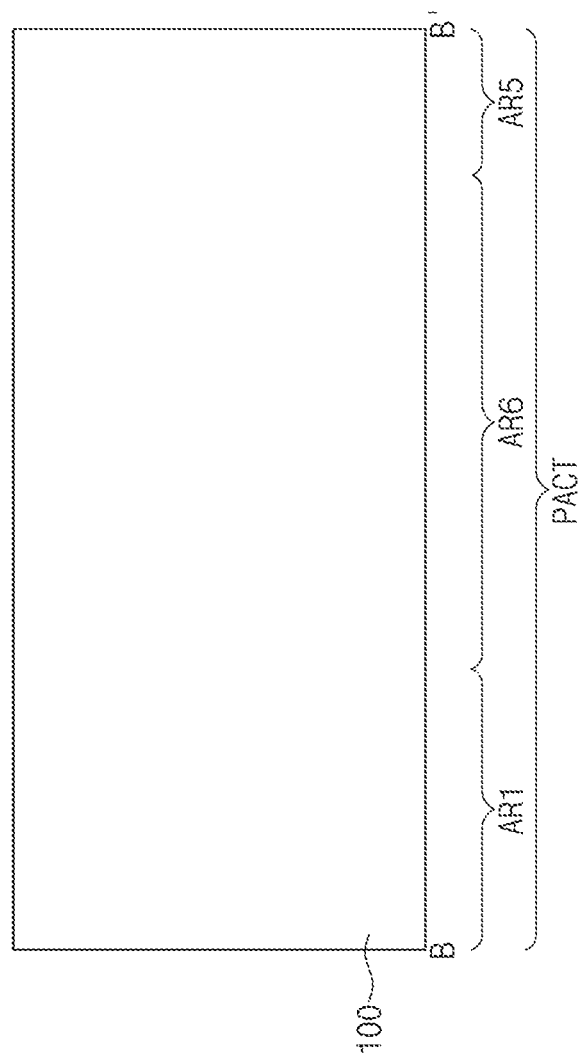

SUB-WORD-LINE DRIVERS AND SEMICONDUCTOR MEMORY DEVICES INCLUDING THE SAME

CROSS-REFERENCE TO RELATED APPLICATION

This U.S. non-provisional patent application claims priority under 35 U.S.C. § 119 to Korean Patent Application No. 10-2021-0080765, filed on Jun. 22, 2021, in the Korean Intellectual Property Office, and the entire contents of the above-identified application are hereby incorporated by reference.

TECHNICAL FIELD

The present disclosure relates to semiconductor memory devices, and in particular, relates to semiconductor memory devices including sub-word-line drivers configured to drive word lines.

BACKGROUND

As demand for high performance semiconductor memory devices continues to increase, efforts are being made to increase the capacity and speed of semiconductor memory devices used in various electronic systems. For a dynamic random access memory (DRAM), which is a typical example of a volatile memory device, a memory cell has as a data storage element a cell capacitor in which electric charges can be stored. In the DRAM, a word line and a bit line are used to perform writing and/or reading operations on the memory cell. A plurality of memory cells, which are connected to each word line, constitute one row operated by a voltage applied to the word line.

To increase the capacity of the DRAM, the number of the memory cells connected to one word line may need to be increased, and/or a distance (or cell pitch) between the word lines may need to be reduced. Furthermore, a speed delay issue may occur when a word line voltage is applied to a word line that is connected with many memory cells. One way to solve the delay issue of the word line voltage is to divide each word line into a plurality of sub-word lines and drive each sub-word line with a sub-word line driver.

SUMMARY

Some aspects of the present disclosure provide highly-integrated and highly-reliable semiconductor memory devices.

According to some embodiments of the inventive concepts disclosed herein, a sub-word-line driver may include a word line pull-up transistor, a word line pull-down transistor, and a keeping transistor configured to maintain a word line at a specific voltage level. The sub-word-line driver may include a peripheral active region on a substrate, the peripheral active region including first to sixth regions, which are arranged around a first device isolation layer of an island shape in a clockwise direction and are connected to each other, a first peripheral gate electrode that corresponds to a gate node of the word line pull-down transistor on the peripheral active region and crossing the second region and the sixth region, a second peripheral gate electrode that corresponds to a gate node of the keeping transistor on the peripheral active region and crossing the fourth region, and a first lower contact coupled to the first region. The first region may correspond to a source node of the word line pull-down transistor and may be supplied with a first voltage through the first lower contact, and the fifth region may correspond to a source node of the keeping transistor. The sixth region may be extended from the first region to the fifth region, below the first peripheral gate electrode. The sixth region may be provided to connect the first region to the fifth region and may be configured to supply the first voltage from the first region to the fifth region.

According to some embodiments of the inventive concepts, a semiconductor memory device may include a first sub-word-line driver. The first sub-word-line driver may include a first pull-up transistor, a first pull-down transistor, a first keeping transistor, and a first parasitic transistor. A first impurity region of the first pull-down transistor may be connected to a second impurity region of the first keeping transistor through the first parasitic transistor, and a gate electrode of the first pull-down transistor may be connected to a gate electrode of the first parasitic transistor. A first voltage, which is supplied to the first impurity region, may be supplied also to the second impurity region through the first parasitic transistor.

According to some embodiments of the inventive concepts, a semiconductor memory device may include a first sub-word-line driver including a first pull-up transistor, a first pull-down transistor, a first keeping transistor, and a first parasitic transistor and a second sub-word-line driver including a second pull-up transistor, a second pull-down transistor, a second keeping transistor, and a second parasitic transistor. The first and second keeping transistors may share a common source region, and each of the first and second pull-down transistors may include an impurity region configured to be supplied with a first voltage. The first parasitic transistor may connect the impurity region of the first pull-down transistor to the common source region, and the second parasitic transistor may connect the impurity region of the second pull-down transistor to the common source region.

BRIEF DESCRIPTION OF THE DRAWINGS

FIGS. 5A, 5B, and 5C are sectional views which are respectively taken along lines A-A', B-B', and C-C' of FIG. 4.

FIGS. 9A, 11A, and 13A are sectional views taken along lines A-A' of FIGS. 8, 10, and 12, respectively.

FIGS. 9B, 11B, and 13B are sectional views taken along lines B-B' of FIGS. 8, 10, and 12, respectively.

DETAILED DESCRIPTION

Figure 1:
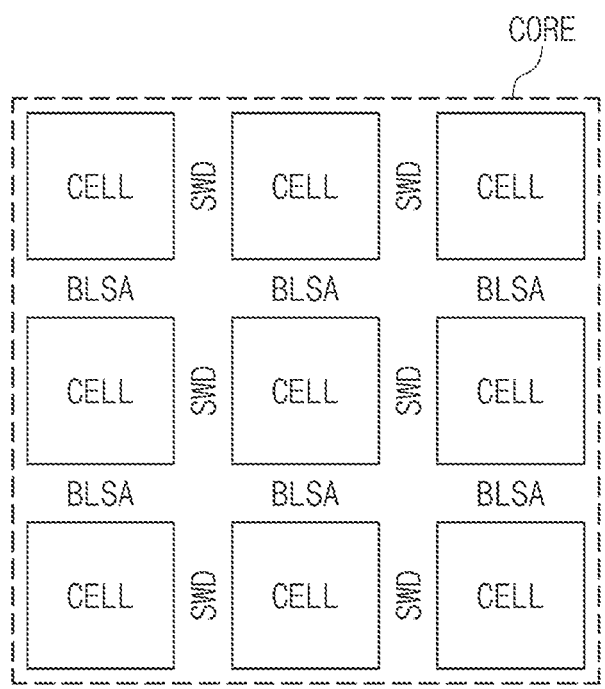
FIG. 1 is a plan view schematically illustrating a semiconductor memory device or a semiconductor memory chip according to some embodiments of the inventive concepts.

FIG. 1 is a plan view schematically illustrating a semiconductor memory device or a semiconductor memory chip according to some embodiments of the inventive concepts.

Referring to FIG. 1, a substrate 100 including a cell region CELL and a core/peri region CORE may be provided. Memory cells, which may be used to store data, may be arranged in an array shape on the cell region CELL. In some embodiments, the cell region CELL may include DRAM cells.

The core/peri region CORE may be provided around the cell region CELL or in a different region from the cell region CELL. Control devices and dummy devices may be formed on the core/peri region CORE. For example, circuits may be provided on the core/peri region CORE that are used to control the memory cells on the cell region CELL.

A plurality of sub-word-line drivers SWD may be arranged on the core/peri region CORE. Each sub-word-line driver SWD may be configured to enable a word line that is connected to a gate electrode of a memory cell transistor. In other words, the sub-word-line driver SWD may be configured to operate the word line.

A plurality of bit line sense amplifiers BLSA may be arranged on the core/peri region CORE. Each bit line sense amplifier BLSA may be configured to enable a bit line that is coupled to the memory cell transistor.

Figure 2:
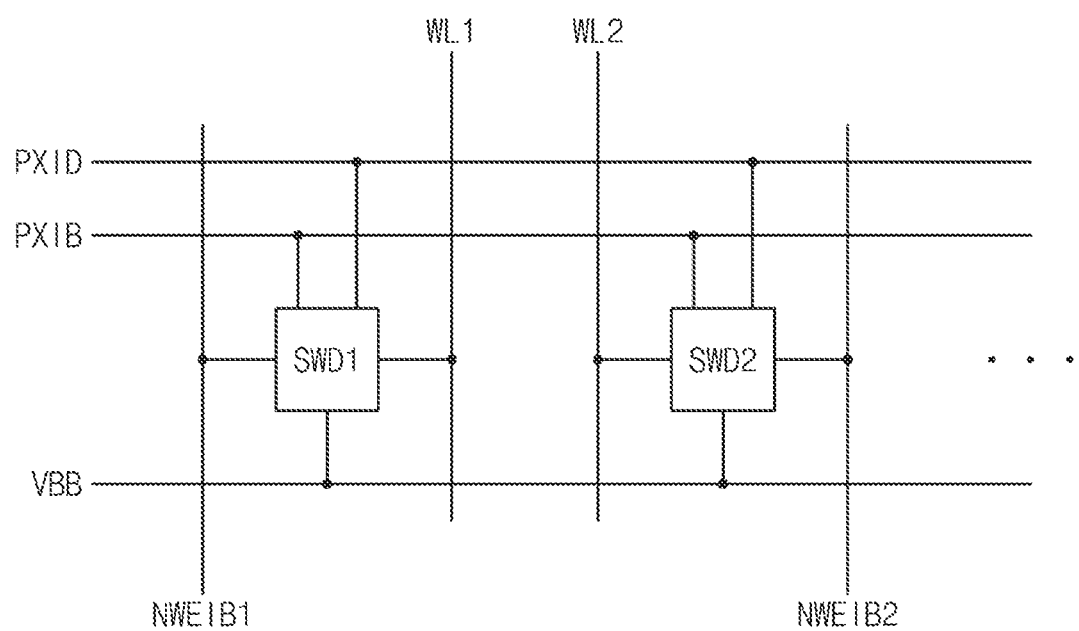
FIG. 2 is a block diagram exemplarily illustrating two adjacent sub-word-line drivers according to some embodiments of the inventive concepts.

FIG. 2 is a block diagram exemplarily illustrating two adjacent sub-word-line drivers according to some embodiments of the inventive concepts. Referring to FIG. 2, first and second sub-word-line drivers SWD1 and SWD2 may be provided to drive first and second word lines WL1 and WL2, respectively.

Each of the first and second sub-word-line drivers SWD1 and SWD2 may be configured to receive driving signals PXID and PXIB. The first sub-word-line driver SWD1 may be activated in response to a first word line enable signal NWEIB1, and the second sub-word-line driver SWD2 may be activated in response to a second word line enable signal NWEIB2.

If the first word line enable signal NWEIB1 is at a low level, the first sub-word-line driver SWD1 may provide a high voltage VPP, which is provided through the driving signal PXID, to the first word line WL1. If the first word line enable signal NWEIB1 is at a high level, the first sub-word-line driver SWD1 may block the driving signal PXID and may precharge the first word line WL1 to a level of a negative or ground voltage VBB.

If the second word line enable signal NWEIB2 is at the low level, the second sub-word-line driver SWD2 may provide the high voltage VPP, which is provided through the driving signal PXID, to the second word line WL2. If the second word line enable signal NWEIB2 is at the high level, the second sub-word-line driver SWD2 may block the driving signal PXID and may precharge the second word line WL2 to the level of the negative or ground voltage VBB. In some embodiments, operations of the first and second sub-word-line drivers SWD1 and SWD2 in response to the low level and the high level of the corresponding first and second wordline enable signals NWEIB1 and NWEIB2 may be reversed from the above.

Each of the first and second sub-word-line drivers SWD1 and SWD2 may include a keeping transistor (not seen in FIG. 2). The keeping transistor may be configured to maintain the word line WL1 or WL2 at the level of the negative voltage VBB after the precharging of the sub-word-line driver SWD1 and SWD2 is performed. The keeping transistor may fix the word line WL1 or WL2 to the level of the negative voltage VBB in response to the driving signal PXIB. Accordingly, even when there is a variation or noise in voltage level of the word line enable signals NWEIB1 and NWEIB2, the keeping transistor may maintain the word lines WL1 and WL2 at a stable voltage value.

The keeping transistors of the first and second sub-word-line drivers SWD1 and SWD2 may include a common source electrode to which the negative voltage VBB is provided, and a common gate electrode to which the driving signal PXIB is applied. That is, the keeping transistors of the first and second sub-word-line drivers SWD1 and SWD2 may be configured to share a single common source electrode and a single common gate electrode.

The keeping transistor of the first sub-word-line driver SWD1 may further include a drain electrode connected to the first word line WL1, and the keeping transistor of the second sub-word-line driver SWD2 may further include a drain electrode connected to the second word line WL2.

According to some embodiments of the inventive concepts, the keeping transistors of the first and second sub-word-line drivers SWD1 and SWD2 may be configured to share an active region below the single common gate electrode, and thus, they may have a relatively large channel region. Accordingly, the semiconductor memory device may have an improved endurance property to high voltage.

Figure 3:
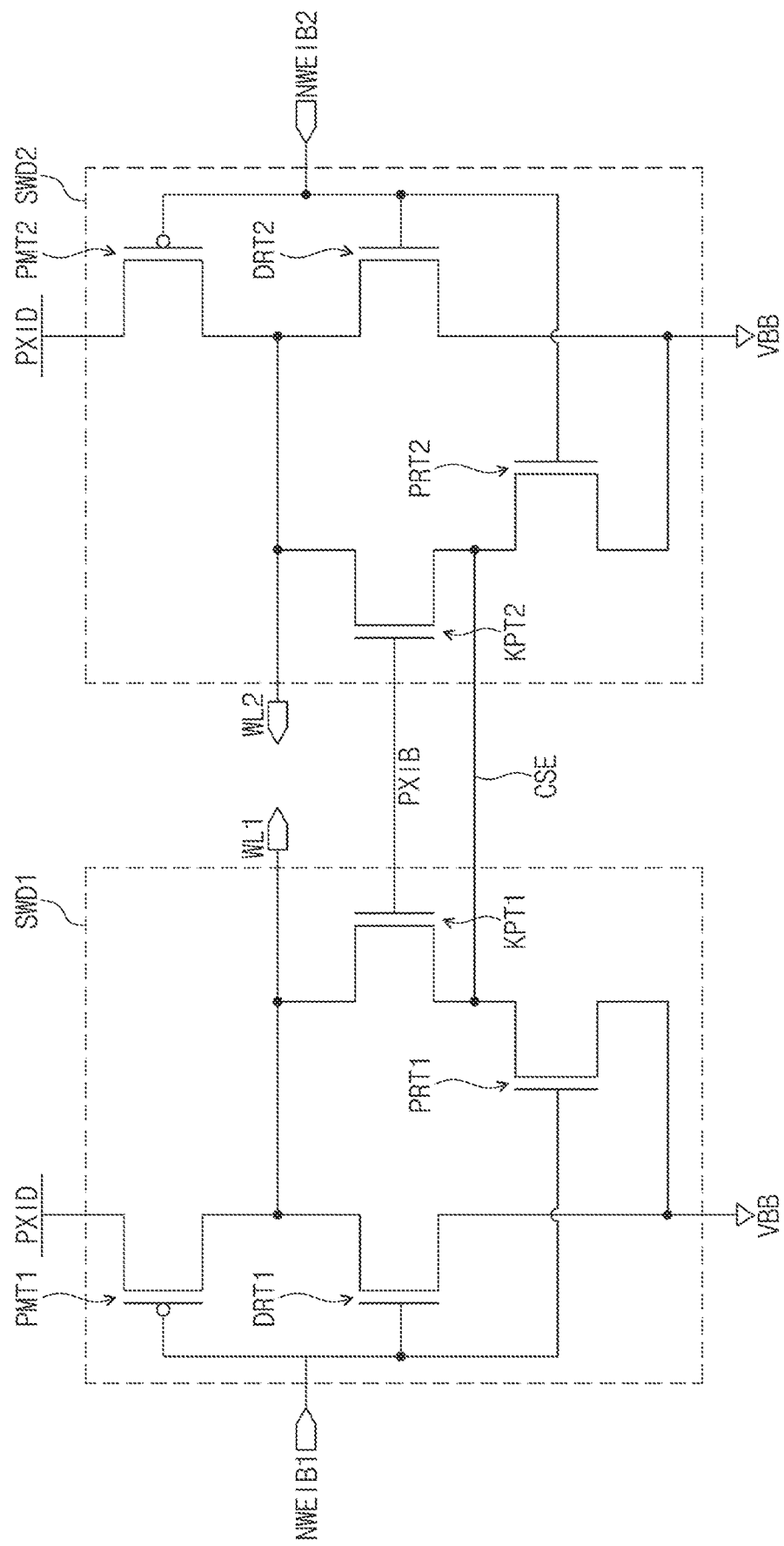
FIG. 3 is a circuit diagram illustrating an example structure of first and second sub-word-line drivers of FIG. 2.

FIG. 3 is a circuit diagram illustrating an example structure of the first and second sub-word-line drivers of FIG. 2. Referring to FIG. 3, the first and second sub-word-line drivers SWD1 and SWD2 may have a circuit structure configured to drive a respective one of the first and second word lines WL1 and WL2.

The driving signals PXID and PXIB may be provided from a driving voltage generator (not shown) to the first sub-word-line driver SWD1. The first word line enable signal NWEIB1 may be provided from a row decoder (not shown) to the first sub-word-line driver SWD1. The first sub-word-line driver SWD1 may include a first pull-up transistor PMT1, a first pull-down transistor DRT1, and a first keeping transistor KPT1. The first pull-up transistor PMT1 may be a PMOSFET, and the first pull-down transistor DRT1 and the first keeping transistor KPT1 may be NMOSFETs.

The first pull-up transistor PMT1 may pull up the first word line WL1 to the level of the driving signal PXID in response to the first word line enable signal NWEIB1 being at the low level. The first pull-down transistor DRT1 may pull down the first word line WL1 to the negative voltage VBB in response to the first word line enable signal NWEIB1 being at the high level. The first keeping transistor KPT1 may maintain the first word line WL1 to the level of the negative voltage VBB when the first word line WL1 is inactivated. For this, the first keeping transistor KPT1 may have a source electrode that is provided with the negative voltage VBB and a drain electrode that is connected to the first word line WL1, and may be turned on or off in response to the driving signal PXIB that is complementary to the driving signal PXID.

The driving signals PXID and PXIB from the driving voltage generator may be provided to the second sub-word-line driver SWD2. The second word line enable signal NWEIB2 may be provided from the row decoder to the second sub-word-line driver SWD2. The second sub-word-line driver SWD2 may include a second pull-up transistor PMT2, a second pull-down transistor DRT2, and a second keeping transistor KPT2.

The second pull-up transistor PMT2 may pull up the second word line WL2 to the level of the driving signal PXID in response to the second word line enable signal NWEIB2 being at the low level. The second pull-down transistor DRT2 may pull down the second word line WL2 to the negative voltage VBB in response to the second word line enable signal NWEIB2 being at the high level. The second keeping transistor KPT2 may maintain the second word line WL2 to the level of the negative voltage VBB when the second word line WL2 is inactivated. For this, the second keeping transistor KPT2 may have a source electrode that is provided with the negative voltage VBB and a drain electrode that is connected to the second word line WL2, and may be turned on or off in response to the driving signal PXIB that is complementary to the driving signal PXID.

The first keeping transistor KPT1 of the first sub-word-line driver SWD1 and the second keeping transistor KPT2 of the second sub-word-line driver SWD2 may be provided with the same gate voltage (e.g., PXIB). The negative voltage VBB may be provided to a common source electrode CSE of the first keeping transistor KPT1 and the second keeping transistor KPT2.

In some embodiments, the first sub-word-line driver SWD1 may further include a first parasitic transistor PRT1, which may be configured to supply the negative voltage VBB to the source electrode of the first keeping transistor KPT1. In some embodiments, the second sub-word-line driver SWD2 may further include a second parasitic transistor PRT2, which may be configured to supply the negative voltage VBB to the source electrode of the second keeping transistor KPT2.

When the first sub-word-line driver SWD1 is operated to drive the first word line WL1, the first parasitic transistor PRT1 may be turned off by applying a low voltage to the first word line enable signal NWEIB1 and the driving signal PXIB. By contrast, since the second word line enable signal NWEIB2 is applied with a high voltage, the second parasitic transistor PRT2 may be turned on, and thus, the negative voltage VBB may be provided to the common source electrode CSE of the first and second keeping transistors KPT1 and KPT2.

When the second sub-word-line driver SWD2 is operated to drive the second word line WL2, the second parasitic transistor PRT2 may be turned off by applying a low voltage to the second word line enable signal NWEIB2 and the driving signal PXIB. By contrast, since the first word line enable signal NWEIB1 is applied with the high voltage, the first parasitic transistor PRT1 may be turned on, and thus, the negative voltage VBB may be provided to the common source electrode CSE of the first and second keeping transistors KPT1 and KPT2.

According to some embodiments of the inventive concepts, since at least one of the first and second parasitic transistors PRT1 and PRT2 may be in the turn-on state during operation, the negative voltage VBB may be supplied (e.g., continuously or always supplied) to the common source electrode CSE of the first and second keeping transistors KPT1 and KPT2 in a stable manner.

Figure 4:
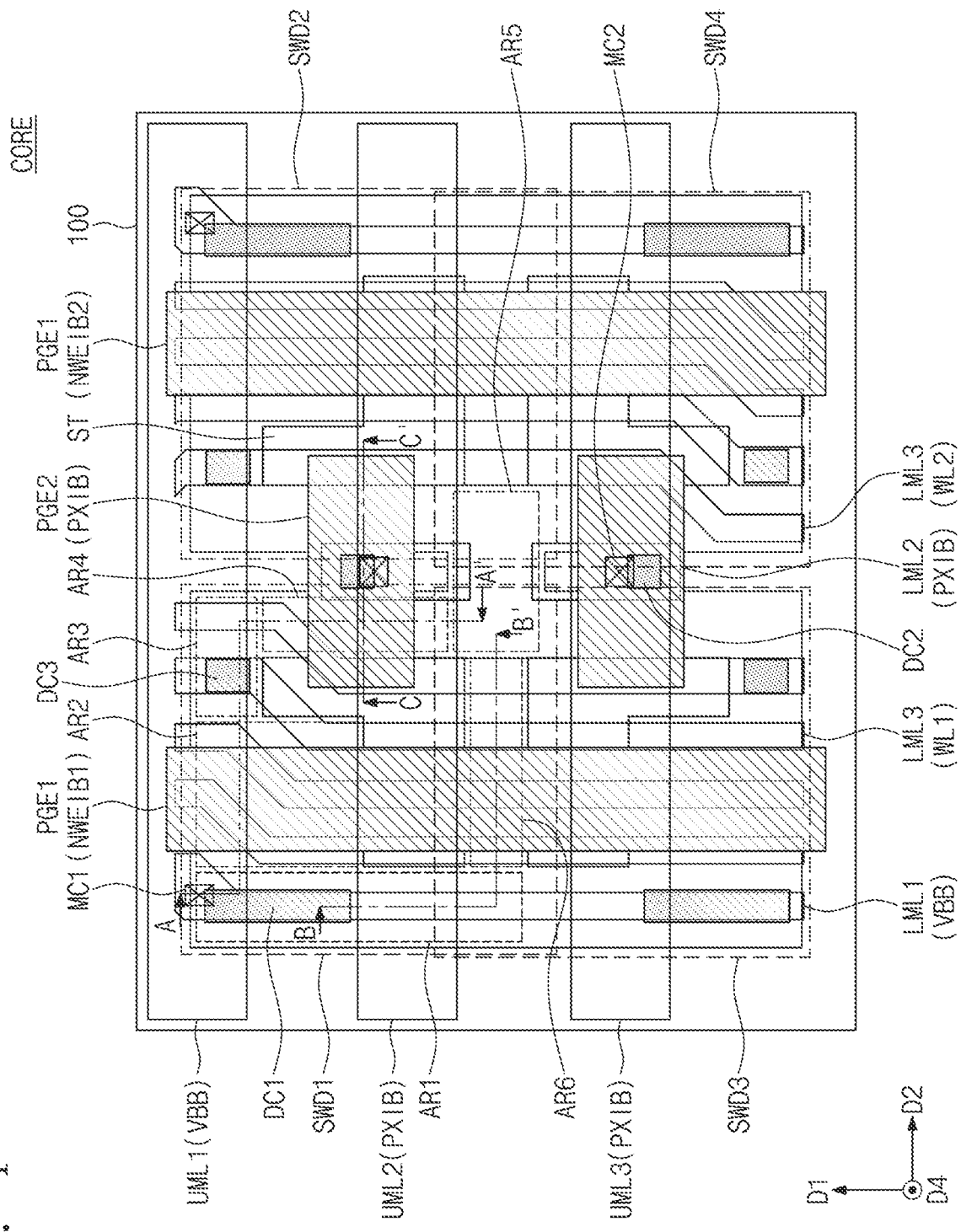
FIG. 4 is a plan view illustrating a sub-word-line driver provided in a semiconductor memory device according to some embodiments of the inventive concepts.
Figure 5C:
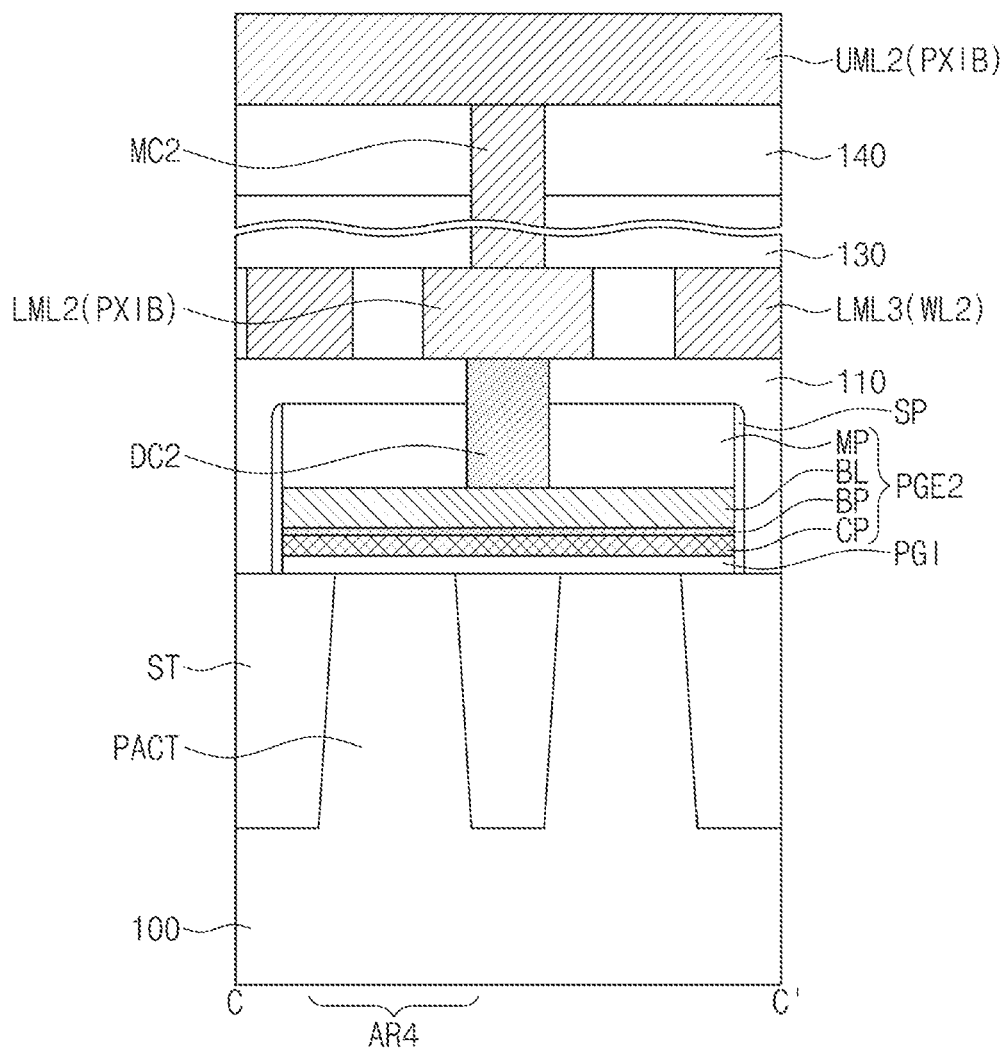

FIG. 4 is a plan view illustrating a sub-word-line driver provided in a semiconductor memory device according to some embodiments of the inventive concepts. FIGS. 5A, 5B, and 5C are sectional views which are respectively taken along lines A-A', B-B', and C-C' of FIG. 4.

Referring to FIGS. 4 and 5A to 5C, sub-word-line drivers SWD1 to SWD4 may be arranged on the core/peri region CORE of the substrate 100. As an example, the substrate 100 may be a semiconductor substrate that is formed of silicon, germanium, or silicon-germanium. A device isolation layer ST may be formed in or on the substrate 100 and may include a silicon oxide layer. In the present embodiment, FIG. 4 illustrates NMOS regions of the sub-word-line drivers SWD1 to SWD4, and PMOS regions thereof are not shown. Hereinafter, the NMOS region of the sub-word-line drivers SWD1 to SWD4 excluding the PMOS region will be described as an example.

The sub-word-line drivers SWD1 to SWD4 may include first to fourth sub-word-line drivers SWD1 to SWD4. The first to fourth sub-word-line drivers SWD1 to SWD4 may be two-dimensionally arranged on the substrate 100, for example in a 2×2 matrix.

The first sub-word-line driver SWD1 and the second sub-word-line driver SWD2 may be adjacent to each other in a second direction D2. The third sub-word-line driver SWD3 and the fourth sub-word-line driver SWD4 may be adjacent to each other in the second direction D2. The first sub-word-line driver SWD1 and the third sub-word-line driver SWD3 may be adjacent to each other in a first direction D1, and the second sub-word-line driver SWD2 and the fourth sub-word-line driver SWD4 may be adjacent to each other in the first direction D1.

The first to fourth sub-word-line drivers SWD1 to SWD4 may be provided so to be symmetric to each other. For example, the first sub-word-line driver SWD1 and the second sub-word-line driver SWD2 may be symmetric to each other about a boundary line that is defined therebetween and is parallel to the first direction D1. The third sub-word-line driver SWD3 and the fourth sub-word-line driver SWD4 may be symmetric to each other about a boundary line that is defined therebetween and is parallel to the first direction D1. The first sub-word-line driver SWD1 and the third sub-word-line driver SWD3 may be symmetric to each other about a boundary line that is defined therebetween and is parallel to the second direction D2. The second sub-word-line driver SWD2 and the fourth sub-word-line driver SWD34 may be symmetric to each other about a boundary line that is defined therebetween and is parallel to the second direction D2. In some embodiments, not all of the components of the first to fourth sub-word-line drivers SWD1 to SWD4 may have symmetry. For example, in the first to fourth sub-word-line drivers SWD1 to SWD4, lower interconnection lines LML1 to LML3 and upper interconnection lines UML1 to UML3, which will be described below, may be provided to have no symmetry.

Hereinafter, the first sub-word-line driver SWD1 will be described in more detail as a representative example of the first to fourth sub-word-line drivers SWD1 to SWD4.

The device isolation layer ST may be provided on the substrate 100 to define a peripheral active region PACT. The peripheral active region PACT of the first sub-word-line driver SWD1 may be used as a body of the first pull-down transistor DRT1, the first keeping transistor KPT1, and the first parasitic transistor PRT1 (e.g., see FIG. 3).

The device isolation layer ST may be provided in a center portion of the peripheral active region PACT of the first sub-word-line driver SWD1 and may have an island shape. When viewed in a plan view, the device isolation layer ST may have an L-shaped island structure. The peripheral active region PACT of the first sub-word-line driver SWD1 may surround the island-shaped device isolation layer ST.

The peripheral active region PACT of the first sub-word-line driver SWD1 may include first to sixth regions AR1 to AR6. The first to sixth regions AR1 to AR6 may be sequentially arranged around the device isolation layer ST in a clockwise direction. In other words, the first to sixth regions AR1 to AR6 may be provided to enclose the island-shaped device isolation layer ST.

The first region AR1 may be a region applied with the negative voltage VBB. The first region AR1 may have a bar shape that extends in length in the first direction D1. The first region AR1 may include a first impurity region DPR1. The first impurity region DPR1 may be an n-type doped region.

The second region AR2 may be extended from the first region AR1 in the second direction D2. In the case where the substrate 100 is a p-type substrate, the second region AR2 may be an undoped region of the substrate 100. A first peripheral gate electrode PGE1 that extends in the first direction D1 may be provided on the second region AR2. When viewed in a plan view, the first peripheral gate electrode PGE1 may have a line shape.

The first word line enable signal NWEIB1 may be applied to the first peripheral gate electrode PGE1 of the first sub-word-line driver SWD1. The first peripheral gate electrode PGE1 may include a first conductive pattern CP, a barrier pattern BP, a second conductive pattern BL, and a mask pattern MP, which are sequentially stacked. A peripheral gate insulating layer PGI may be provided between the first peripheral gate electrode PGE1 and the substrate 100. In other words, the peripheral gate insulating layer PGI may be interposed between the first conductive pattern CP and the substrate 100. A pair of spacers SP may be provided on opposite side surfaces of the first peripheral gate electrode PGE1.

For example, the first conductive pattern CP may be formed of or include at least one doped semiconductor material (e.g., doped silicon, doped germanium, and so forth). The barrier pattern BP may be formed of or include at least one conductive metal nitride (e.g., titanium nitride or tantalum nitride). The second conductive pattern BL may be formed of or include at least one metallic material (e.g., titanium, tantalum, tungsten, copper, or aluminum). The peripheral gate insulating layer PGI may include a first insulating layer (e.g., a silicon oxide layer) and a second insulating layer (e.g., silicon oxynitride layer), which are sequentially stacked. The spacers SP may be formed of or include at least one of silicon oxide, silicon nitride, and/or silicon oxynitride, as examples.

The third region AR3 may be extended from the second region AR2 in the second direction D2. The third region AR3 may be a region that is connected to the first word line WL1. The third region AR3 may include a second impurity region DPR2. The second impurity region DPR2 may be an n-type doped region.

The first impurity region DPR1 of the first region AR1, the second region AR2, the second impurity region DPR2 of the third region AR3, and the first peripheral gate electrode PGE1 on the second region AR2 may constitute the first pull-down transistor DRT1 of FIG. 3. The second region AR2 may be used as a channel region of the first pull-down transistor DRT1. In other words, the first region AR1 and the third region AR3 may be connected to each other through the second region AR2, depending on an operation of the first pull-down transistor DRT1.

The fourth region AR4 may be extended from the third region AR3 in an opposite direction of the first direction D1. In the case where the substrate 100 is a p-type substrate, the fourth region AR4 may be an undoped region. A second peripheral gate electrode PGE2, which is extended in the second direction D2, may be provided on the fourth region AR4. When viewed in a plan view, the second peripheral gate electrode PGE2 may have a rectangular shape.

The driving signal PXIB may be applied to the second peripheral gate electrode PGE2 of the first sub-word-line driver SWD1. The second peripheral gate electrode PGE2 may include the first conductive pattern CP, the barrier pattern BP, the second conductive pattern BL, and the mask pattern MP, which are sequentially stacked. The peripheral gate insulating layer PGI may be provided between the second peripheral gate electrode PGE2 and the substrate 100. A pair of the spacers SP may be provided on opposite side surfaces of the second peripheral gate electrode PGE2.

The fifth region AR5 may be in a center region of the first to fourth sub-word-line drivers SWD1 to SWD4. The fifth region AR5 may be at a center of the core/peri region CORE. A side portion of the fifth region AR5 may be connected to an end portion of the fourth region AR4. The fifth region AR5 may include a third impurity region DPR3. The third impurity region DPR3 may be an n-type doped region.

The second impurity region DPR2 of the third region AR3, the fourth region AR4, the third impurity region DPR3 of the fifth region AR5, and the second peripheral gate electrode PGE2 on the fourth region AR4 may constitute the first keeping transistor KPT1 of FIG. 3. The fourth region AR4 may be used as a channel region of the first keeping transistor KPT1. In other words, the third region AR3 and the fifth region AR5 may be connected to each other through the fourth region AR4, depending on an operation of the first keeping transistor KPT1.

The sixth region AR6 may be extended from the first region AR1 toward the fifth region AR5 in the second direction D2. In other words, the sixth region AR6 may be interposed between the first region AR1 and the fifth region AR5. The sixth region AR6 may be a bridge region that connects the first region AR1 to the fifth region AR5. The sixth region AR6 may have a bar shape that extends in the second direction D2.

In the case where the substrate 100 is a p-type substrate, the sixth region AR6 may be an undoped region of the substrate 100. The first peripheral gate electrode PGE1 on the second region AR2 may be extended to a region on the sixth region AR6.

The first impurity region DPR1 of the first region AR1, the sixth region AR6, the third impurity region DPR3 of the fifth region AR5, and the first peripheral gate electrode PGE1 on the sixth region AR6 may constitute the first parasitic transistor PRT1 of FIG. 3. The sixth region AR6 may be used as a channel region of the first parasitic transistor PRT1. In other words, the first region AR1 and the fifth region AR5 may be connected to each other through the sixth region AR6, depending on an operation of the first parasitic transistor PRT1. As a result, the negative voltage VBB may be applied from the first region AR1 to the fifth region AR5 through the sixth region AR6 (e.g., see FIG. 5B).

The fifth region AR5 may be used as a common source region of the keeping transistors of the first to fourth sub-word-line drivers SWD1 to SWD4. The fifth region AR5 may correspond to the common source electrode CSE or the common source node of the first and second keeping transistors KPT1 and KPT2 of FIG. 3. For example, since the negative voltage VBB from the first region AR1 is supplied to the fifth region AR5 through the sixth region AR6, it may be unnecessary to provide an additional lower contact in the fifth region AR5 that is used to supply the negative voltage VBB. Since the additional lower contact is not needed, an additional upper contact for supplying the negative voltage VBB may also not be needed.

First to fourth interlayer insulating layers 110, 120, 130, and 140 may be sequentially stacked on the substrate 100. A plurality of lower contacts DC1 to DC3 may be provided to penetrate the first interlayer insulating layer 110. The lower contacts DC1 to DC3 may be formed of or include at least one of metallic materials (e.g., titanium, tantalum, tungsten, copper, or aluminum).

For example, the lower contacts DC1 to DC3 may include first to third lower contacts DC1, DC2, and DC3, which are provided in the first sub-word-line driver SWD1. The first lower contact DC1 may be coupled to the first impurity region DPR1 of the first region AR1. The second lower contact DC2 may be provided to penetrate the mask pattern MP and may be coupled to the second peripheral gate electrode PGE2. The third lower contact DC3 may be coupled to the second impurity region DPR2 of the third region AR3.

The lower interconnection lines LML1 to LML3 may be provided in the second interlayer insulating layer 120. When viewed in a plan view, the lower interconnection lines LML1 to LML3 may be line-shaped patterns, which extend in the first direction D1 and are parallel to each other. At least one of the lower interconnection lines LML1 to LML3 may include a portion, which is extended in the first direction D1, and another portion, which is inclined at an angle to or toward the second direction D2. The lower interconnection lines LML1 to LML3 may be formed of or include at least one metallic material (e.g., titanium, tantalum, tungsten, copper, or aluminum).

The lower interconnection lines LML1 to LML3 may include first to third lower interconnection lines LML1, LML2, and LML3. The first lower interconnection line LML1 may be a lower interconnection line provided with the negative voltage VBB. The first lower interconnection line LML1 may be used to provide the negative voltage VBB to the first region AR1 through the first lower contact DC1.

The second lower interconnection line LML2 may be a pad provided with the driving signal PXIB. When viewed in a plan view, the second lower interconnection line LML2 may have a rectangular shape that is elongated or extended in the first direction D1. The second lower interconnection line LML2 may be provided on the second peripheral gate electrode PGE2 and may apply the driving signal PXIB to the second peripheral gate electrode PGE2 through the second lower contact DC2.

The third lower interconnection lines LML3 may be the first and second word lines WL1 and WL2. For example, the third lower interconnection line LML3 of the first sub-word-line driver SWD1 may be the first word line WL1. The third lower interconnection line LML3 (e.g., the first word line WL1) may be coupled to the third region AR3 through the third lower contact DC3. The third lower interconnection line LML3 (e.g., the first word line WL1) may be connected to the first pull-down transistor DRT1 and the first keeping transistor KPT1 of the first sub-word-line driver SWD1.

The upper interconnection lines UML1 to UML3 may be provided in the fourth interlayer insulating layer 140. When viewed in a plan view, the upper interconnection lines UML1 to UML3 may be line-shaped patterns, which extend in the second direction D2 and are parallel to each other. The upper interconnection lines UML1 to UML3 may be formed of or include at least one metallic material (e.g., titanium, tantalum, tungsten, copper, or aluminum).

The upper interconnection lines UML1 to UML3 may include a first upper interconnection line UML1 provided with the negative voltage VBB, a second upper interconnection line UML2 provided with the driving signal PXIB of the first and second sub-word-line drivers SWD1 and SWD2, and a third upper interconnection line UML3 provided with the driving signal PXIB of the third and fourth sub-word-line drivers SWD3 and SWD4.

Upper contacts MC1 and MC2 may penetrate the third interlayer insulating layer 130 and to connect the upper interconnection lines UML1 to UML3 to the lower interconnection lines LML1 to LML3. The upper contacts MC1 and MC2 may be formed of or include at least one metallic material (e.g., titanium, tantalum, tungsten, copper, or aluminum).

For example, a first upper contact MC1 may connect the first lower interconnection line LML1 to the first upper interconnection line UML1. The negative voltage VBB may be provided from the first upper interconnection line UML1 to the first lower interconnection line LML1 through the first upper contact MC1.

A second upper contact MC2 may connect the second lower interconnection line LML2 to the second upper interconnection line UML2. The driving signal PXIB for the first and second sub-word-line drivers SWD1 and SWD2 may be provided from the second upper interconnection line UML2 to the second lower interconnection line LML2 through the second upper contact MC2.

According to some embodiments of the inventive concepts, additional conduction patterns (e.g., lower and upper contacts and lower and upper interconnection lines) for supplying the negative voltage VBB may be omitted or not provided on the fifth region AR5 (that is, the common source region of the keeping transistors) of the sub-word-line drivers. Accordingly, it may be possible to reduce an area of the fifth region AR5 of the sub-word-line drivers and thereby to reduce a chip size of a semiconductor memory device.

According to some embodiments of the inventive concepts, since it may be possible to reduce the number of the lower interconnection lines for supplying the negative voltage VBB, the lower interconnection lines may be arranged with an increased pitch. Furthermore, it may be possible to reduce a process defect, which may be caused by reduction in pattern pitch, in a process of forming the lower interconnection lines, and thereby improve a reliability of the sub-word-line driver of the semiconductor memory device.

Although not shown, the second to fourth sub-word-line drivers SWD2, SWD3, and SWD4 may be configured to have substantially the same structure as the first sub-word-line driver SWD1 (or different from but symmetrical to the structure of the first sub-word-line driver SWD1) and may be operated in the same manner as the first sub-word-line driver SWD1.

According to some embodiments of the inventive concepts, the negative voltage VBB may be provided to the first region AR1 of each of the first to fourth sub-word-line drivers SWD1 to SWD4, and the first region AR1, to which the negative voltage VBB is provided, may be connected to the fifth region AR5, which may be used as the common source region of the keeping transistors, through the sixth region AR6. As a result, it may be possible to supply the negative voltage VBB to the fifth region AR5 in a relatively stable and/or continuous manner.

Figure 6:
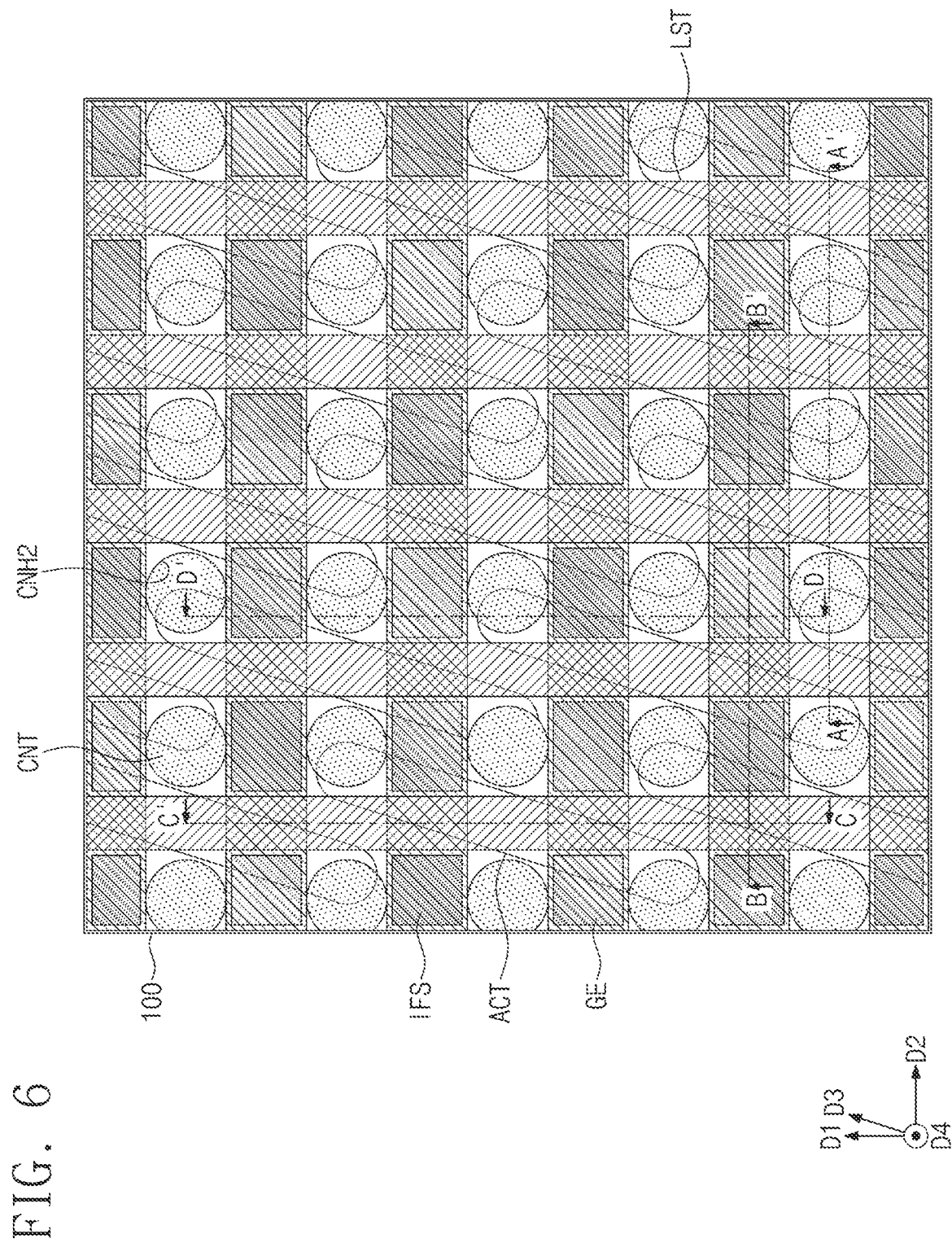
FIG. 6 is a plan view illustrating a cell region of a semiconductor memory device according to some embodiments of the inventive concepts.

FIG. 6 is a plan view illustrating a cell region of a semiconductor memory device according to some embodiments of the inventive concepts. FIGS. 7A, 7B, 7C, and 7D are sectional views which are respectively taken along lines A-A', B-B', C-C', and D-D' of FIG. 6.

Referring to FIGS. 6 and 7A to 7D, DRAM cells, which are configured to store data, may be provided on the cell region CELL of the substrate 100. In greater detail, the device isolation layer ST may be provided on the substrate 100 to define active patterns ACT of memory transistors constituting DRAM cells.

The active patterns ACT may be formed by patterning an upper portion of the substrate 100. Each of the active patterns ACT may be extended in a third direction D3 that is parallel to a top surface of the substrate 100. In other words, each of the active patterns ACT may have a long axis parallel to the third direction D3. The active patterns ACT may be two-dimensionally arranged in the first and second directions D1 and D2. The active patterns ACT may be spaced apart from each other in the third direction D3.

Each of the active patterns ACT may have a decreasing width, in a direction (e.g., a fourth direction D4) perpendicular to the top surface of the substrate 100. In other words, each of the active patterns ACT may have a width that decreases with increasing distance from a bottom surface of the substrate 100.

First and second trenches TR1 and TR2 may be defined between the active patterns ACT. The device isolation layer ST may fill the first and second trenches TR1 and TR2 between the active patterns ACT. The first trench TR1 may be defined between a pair of active patterns ACT that are adjacent to each other in the second direction D2. The second trench TR2 may be defined between a pair of the active patterns ACT that are adjacent to each other in the third direction D3.

Figure 7A:
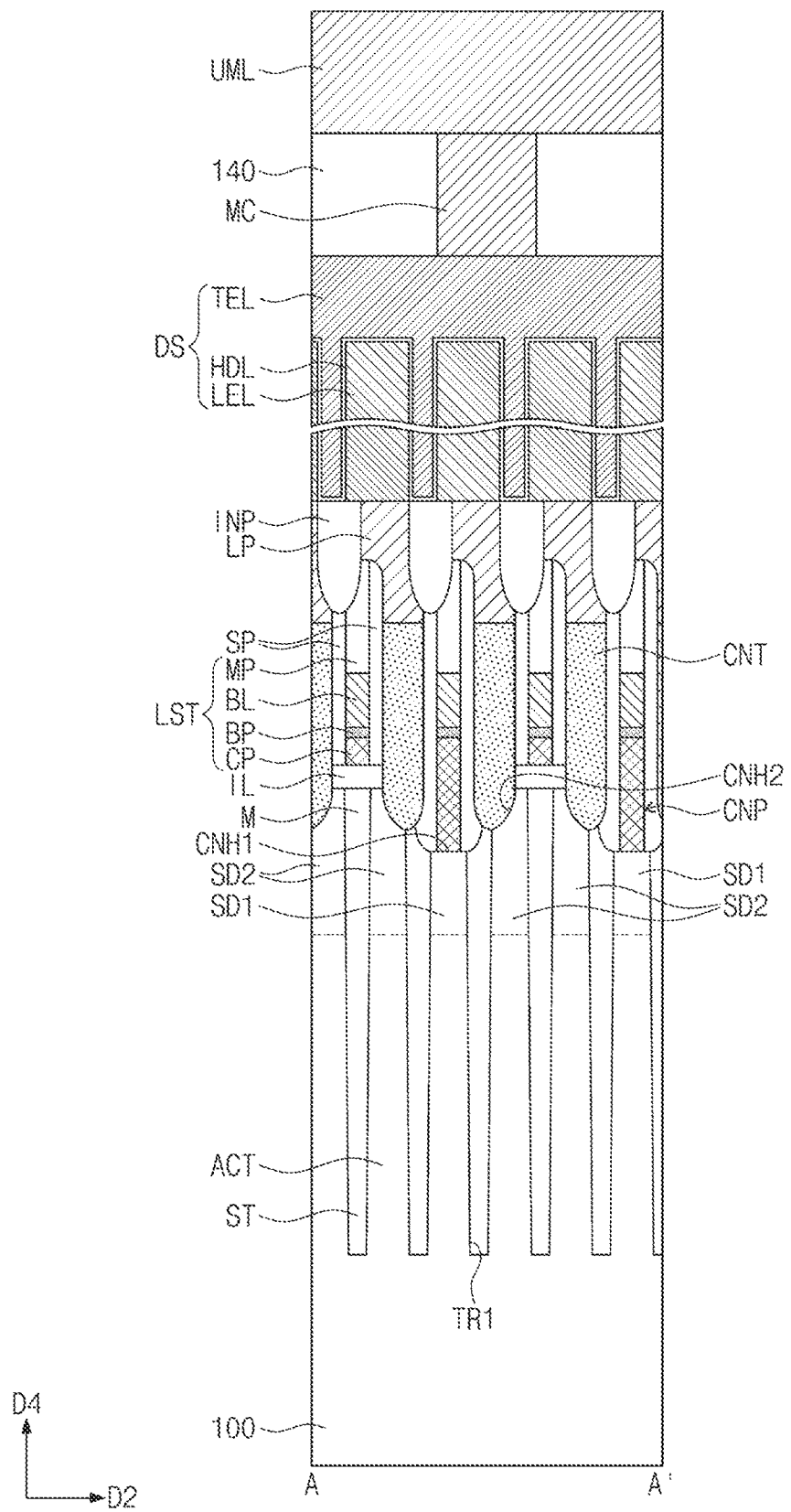
FIGS. 7A, 7B, 7C, and 7D are sectional views which are respectively taken along lines A-A', B-B', C-C', and D-D' of FIG. 6.
Figure 7B:
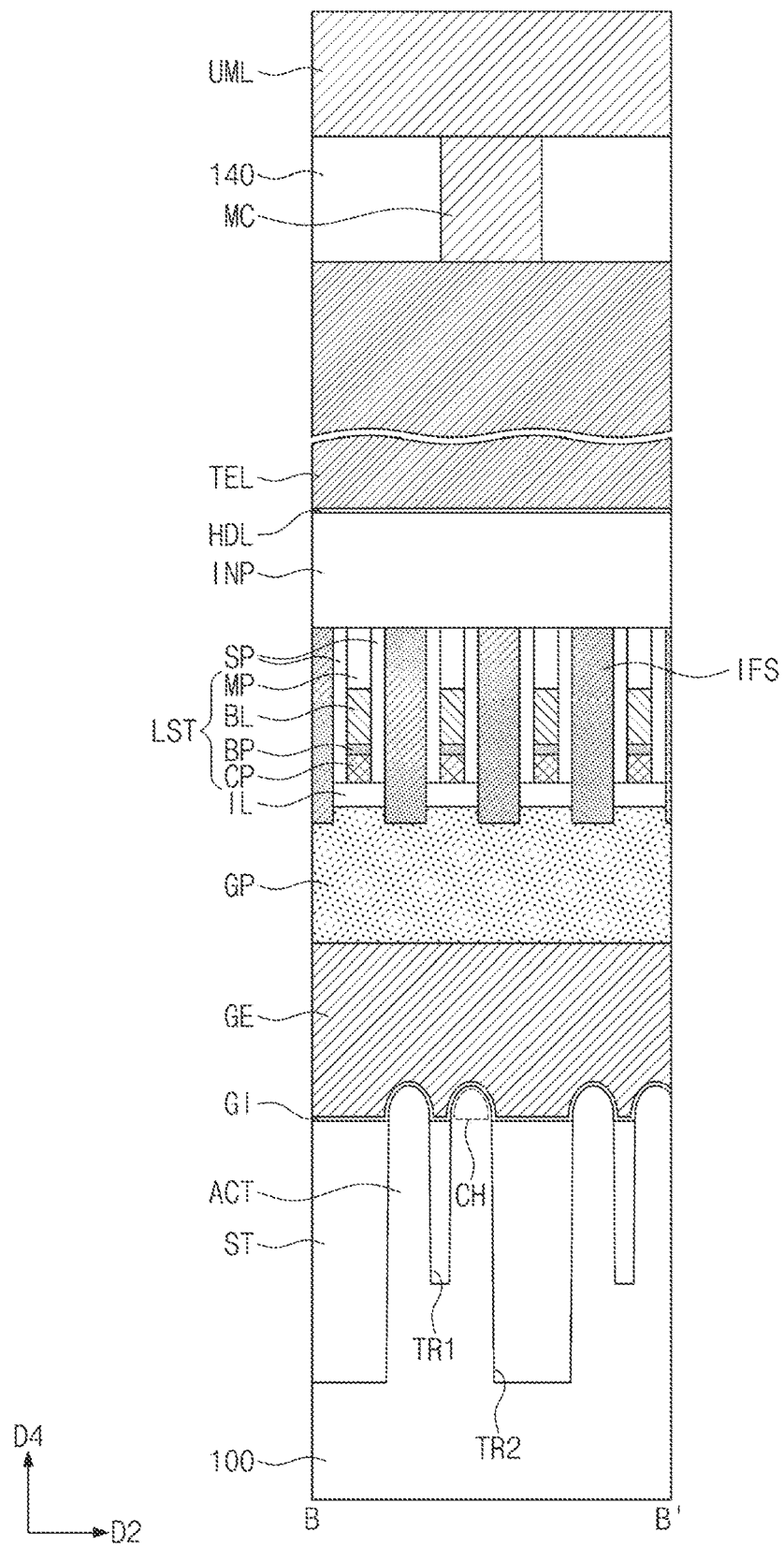

A distance between the adjacent pair of the active patterns ACT in the second direction D2 may be smaller than a distance between the adjacent pair of the active patterns ACT in the third direction D3. Accordingly, the second trench TR2 may be deeper than the first trench TR1. In other words, a bottom of the second trench TR2 may be lower than a bottom of the first trench TR1 (as best seen in FIG. 7B).

An upper portion of each of the active patterns ACT may include a first source/drain region SD1 and a pair of second source/drain regions SD2. The first source/drain region SD1 may be positioned between the pair of second source/drain regions SD2. In other words, when viewed in a plan view, the second source/drain region SD2, the first source/drain region SD1, and the second source/drain region SD2 may be sequentially arranged in the third direction D3.

Figure 7C:
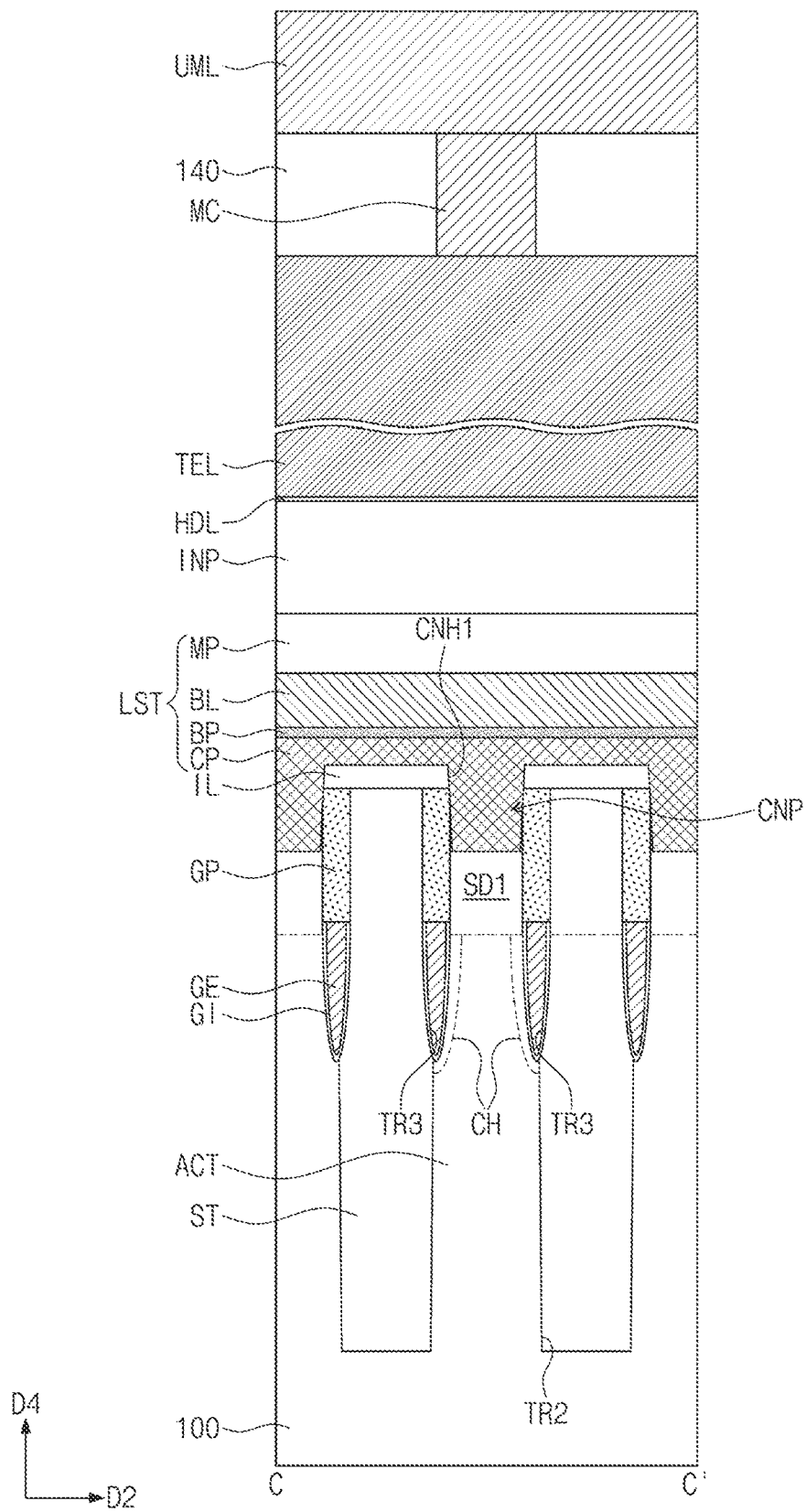
Figure 7D:
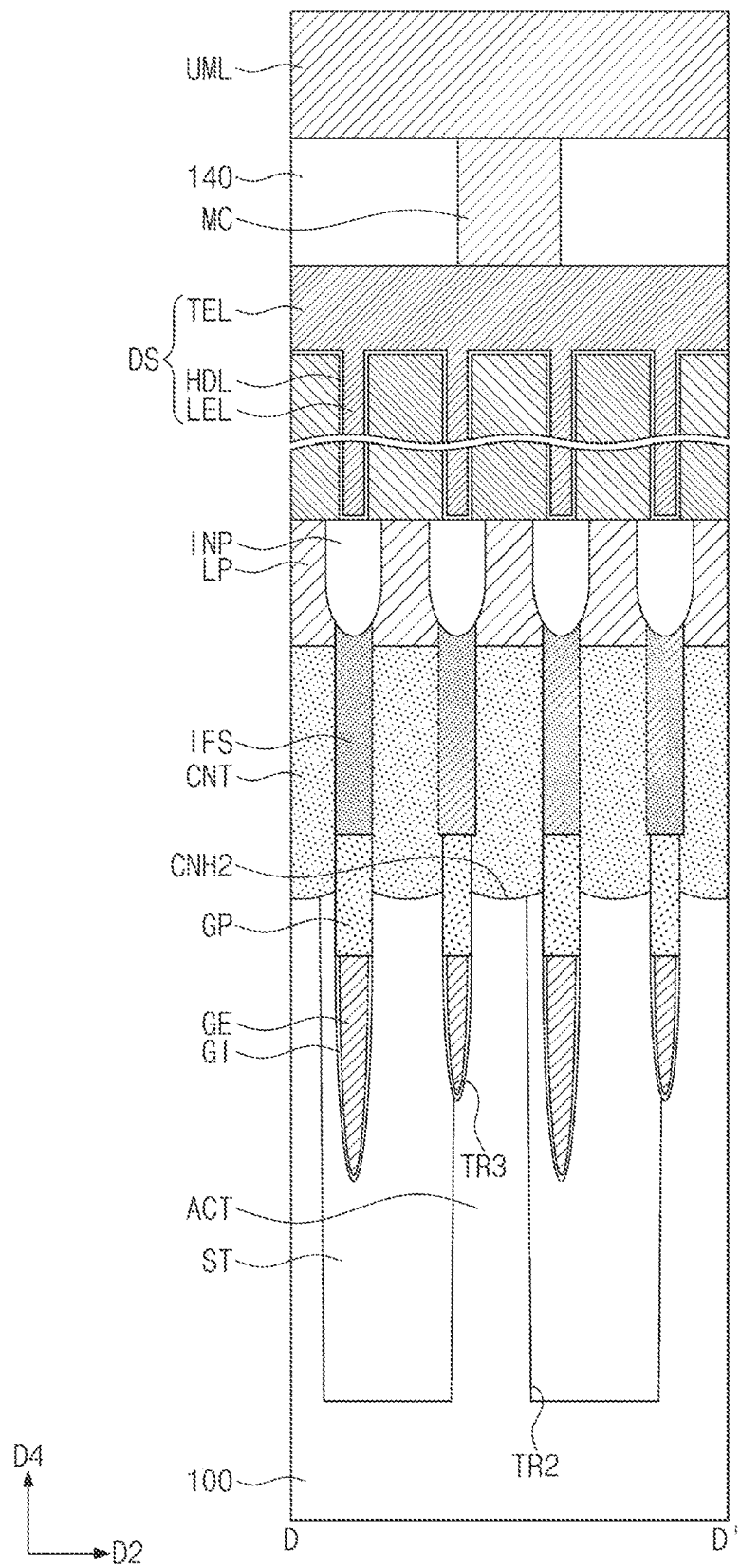

A pair of third trenches TR3 may be defined in each of the active patterns ACT (e.g., see FIG. 7C). Each of the third trenches TR3 may be defined between the first source/drain region SD1 and the second source/drain region SD2. The third trench TR3 may penetrate an upper portion of the active pattern ACT and may extend downward from a top surface of the active pattern ACT toward a bottom surface of the substrate 100. A bottom of the third trench TR3 may be higher than bottoms of the first and second trenches TR1 and TR2.

The upper portion of each of the active patterns ACT may further include a pair of channel regions CH. When viewed in a plan view, the channel region CH may be interposed between the first source/drain region SD1 and the second source/drain region SD2. The channel region CH may be located below the third trench TR3 (e.g., see FIG. 7C). Thus, the channel region CH may be lower than the first and second source/drain regions SD1 and SD2.

Gate electrodes GE may cross the active patterns ACT and the device isolation layer ST. The gate electrodes GE may be provided in respective ones of the third trenches TR3. The gate electrodes GE may extend in the second direction D2 and parallel to each other. A pair of the gate electrodes GE may be provided on a pair of the channel regions CH of the active pattern ACT. In other words, when viewed in a plan view, the gate electrode GE may be interposed between the first source/drain region SD1 and the second source/drain region SD2. A top surface of the gate electrode GE may be lower than the top surface of the active pattern ACT (e.g., a top surface of the first source/drain region SD1 or a top surface of the second source/drain region SD2).

The gate electrodes GE may be the word lines of the memory cells. In other words, the gate electrodes GE on the cell region CELL may be electrically and respectively connected to the third lower interconnection lines LML3 on the core/peri region CORE.

As seen in FIG. 7C, an upper portion of the gate electrode GE may be adjacent to the first source/drain region SD1 of the active pattern ACT. A lower portion of the gate electrode GE may be adjacent to the channel region CH.

Referring back to FIGS. 6 and 7A to 7D, a gate insulating layer GI may be interposed between the gate electrode GE and the active pattern ACT. A gate capping layer GP may be provided on the gate electrode GE. The gate capping layer GP may cover the top surface of the gate electrode GE. A top surface of the gate capping layer GP may be coplanar with the top surface of the active pattern ACT.

The gate electrode GE may be formed of or include at least one conductive metal nitride (e.g., titanium nitride or tantalum nitride) and/or metallic material (e.g., titanium, tantalum, tungsten, copper, or aluminum). The gate insulating layer GI may be formed of or include at least one of silicon oxide, silicon nitride, silicon oxynitride, and/or high-k dielectric materials. As an example, the high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may be formed of or include at least one of silicon oxide, silicon nitride, and/or silicon oxynitride.

An insulating layer IL may be provided on the substrate 100. In some embodiments, the insulating layer IL on the cell region CELL may be formed when the peripheral gate insulating layer PGI on the core/peri region CORE described above are formed. The insulating layer IL may include first contact holes CNH1 that expose the first source/drain regions SD1 of the active patterns ACT.

Line structures LST may be provided on the insulating layer IL that extend in the first direction D1 and are parallel to each other. The line structures LST may be arranged in the second direction D2. When viewed in a plan view, the line structures LST may be provided to perpendicularly cross the gate electrodes GE (e.g., see FIG. 6). A pair of the spacers SP may be provided on opposite side surfaces of each of the line structures LST.

Each of the line structures LST may include the first conductive pattern CP, the barrier pattern BP, the second conductive pattern BL, and the mask pattern MP, which are sequentially stacked. In some embodiments, the line structure LST on the cell region CELL may be formed when the peripheral gate electrodes PGE1 and PGE2 on the core/peri region CORE described above are formed.

The first conductive pattern CP may include a contact portion CNP, which is formed to fill the first contact hole CNH1 and is coupled to the first source/drain region SD1. More specifically, the contact portion CNP may be provided to penetrate the insulating layer IL and may be extended toward the bottom surface of the substrate 100. The contact portion CNP may be in direct contact with the first source/drain region SD1.

The barrier pattern BP may prevent or suppress a metallic material in the second conductive pattern BL from being diffused into the first conductive pattern CP. The second conductive pattern BL may be electrically connected to the first source/drain region SD1 through the barrier pattern BP and the first conductive pattern CP. The second conductive pattern BL may be used as a bit line.

A plurality of insulating fences IFS may be provided on the gate capping layer GP. Each of the insulating fences IFS may penetrate the insulating layer IL and may be extended to an upper portion of the gate capping layer GP.

As seen in FIG. 6, the insulating fences IFS may be two-dimensionally arranged in the first and second directions D1 and D2. In greater detail, the insulating fences IFS may be arranged in the second direction D2, on the gate capping layer GP extending in the second direction D2. The insulating fences IFS and the line structures LST may be alternately arranged in the second direction D2.

Contacts CNT may penetrate the insulating layer IL and may be coupled to respective ones of the second source/drain regions SD2. Each of the contacts CNT may at least partially fill a second contact hole CNH2, which is formed by partially etching an upper portion of the second source/drain region SD2. As seen in FIG. 7A, the contact CNT may be in direct contact with the second source/drain region SD2, which is exposed through the second contact hole CNH2. In addition, the contact CNT may be in contact with a side surface of the spacer SP and a top surface of the device isolation layer ST. The contact CNT may be spaced apart from the line structure LST adjacent thereto by the spacer SP. Each of the contacts CNT may be formed of or include at least one doped semiconductor material (e.g., doped silicon, doped germanium, and so forth).

As seen in FIG. 6, the contacts CNT may be two-dimensionally arranged in the first and second directions D1 and D2. In greater detail, the contacts CNT and the line structures LST may be alternately arranged in the second direction D2. The contacts CNT and the insulating fences IFS may be alternately arranged in the first direction D1.

Landing pads LP may be provided on and coupled to the contacts CNT, respectively. The landing pads LP may be electrically connected to the second source/drain regions SD2, respectively, through the contacts CNT. The landing pad LP may be misaligned to the contact CNT. In other words, the landing pad LP may be horizontally offset from a center of the contact CNT (e.g., see FIG. 7A).

In some embodiments, the landing pads LP on the cell region CELL may be formed when the lower interconnection lines LML1 to LML3 on the core/peri region CORE described above are formed. In this case, the landing pads LP on the cell region CELL may be located at substantially the same level as the lower interconnection lines LML1 to LML3 on the core/peri region CORE.

An insulating pattern INP may be provided on the mask patterns MP. The insulating pattern INP may be formed to define a planar shape of the landing pads LP. Adjacent ones of the landing pads LP may be separated from each other by the insulating pattern INP.

A data storing element DS may be provided on the landing pads LP. In greater detail, the data storing element DS may include first electrodes LEL, which are provided on the landing pads LP, respectively. The first electrodes LEL may be connected to the landing pads LP, respectively. The data storing element DS may further include a second electrode TEL on the first electrodes LEL and a dielectric layer HDL between the first electrodes LEL and the second electrode TEL. The first electrode LEL, the dielectric layer HDL, and the second electrode TEL may constitute a capacitor which can be used to store data.

Each of the first electrodes LEL may in the form of a solid pillar, but the present disclosure and the inventive concepts thereof are not limited thereto. For example, each of the first electrodes LEL may be shaped like a cylinder with a closed bottom. The first electrodes LEL may be arranged in a zigzag shape in the first or second direction D1 or D2 to form a honeycomb-shaped arrangement. Alternatively, the first electrodes LEL may be arranged in a matrix shape in the first and second directions D1 and D2.

Each of the first electrodes LEL may be formed of or include at least one of, for example, impurity-doped silicon, metals (e.g., tungsten), or conductive metal compounds (e.g., titanium nitride). The dielectric layer HDL may be formed of or include at least one of high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof). The second electrode TEL may be formed of or include at least one of doped silicon, Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or combinations thereof, as examples.

The fourth interlayer insulating layer 140 may be on the second electrode TEL. An upper interconnection line UML may be provided in the fourth interlayer insulating layer 140. The upper interconnection line UML may be electrically connected to the second electrode TEL through a plurality of upper contacts MC, which may penetrate the fourth interlayer insulating layer 140.

In some embodiments, the upper interconnection line UML on the cell region CELL may be formed when the upper interconnection lines UML1 to UML3 on the core/peri region CORE described above are formed. In this case, the upper interconnection line UML on the cell region CELL may be located at substantially the same level as the upper interconnection lines UML1 to UML3 on the core/peri region CORE.

Figure 8:
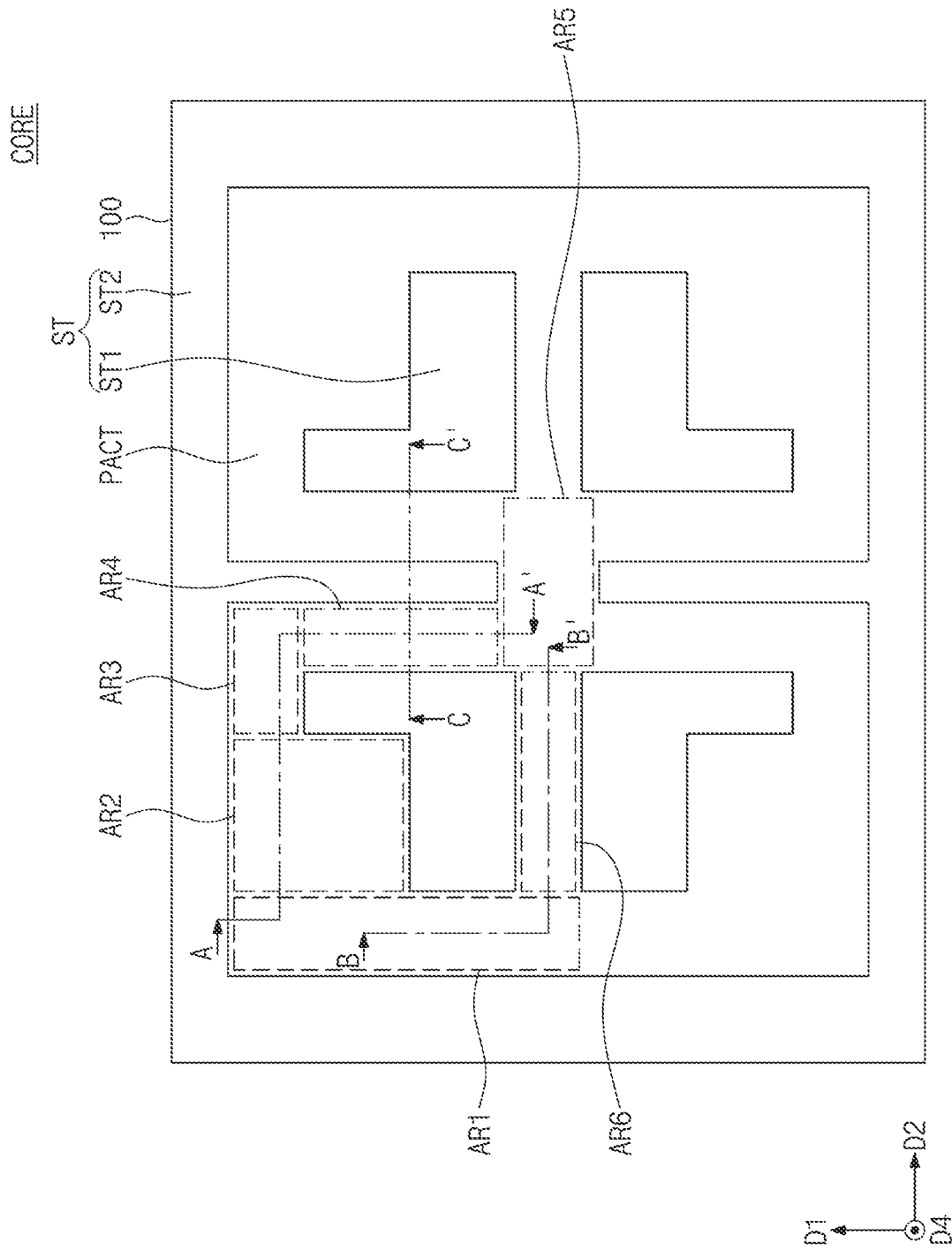
FIGS. 8, 10, and 12 are plan views illustrating operations in a method of fabricating a sub-word-line driver of a semiconductor memory device, according to some embodiments of the inventive concepts.
Figure 9C:
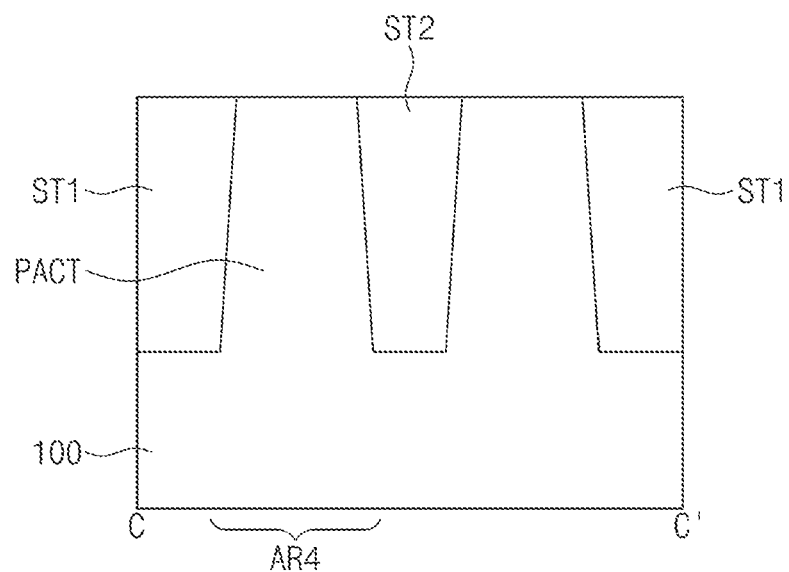
FIGS. 9C, 11C, and 13C are sectional views taken along lines C-C' of FIGS. 8, 10, and 12, respectively.
Figure 10:
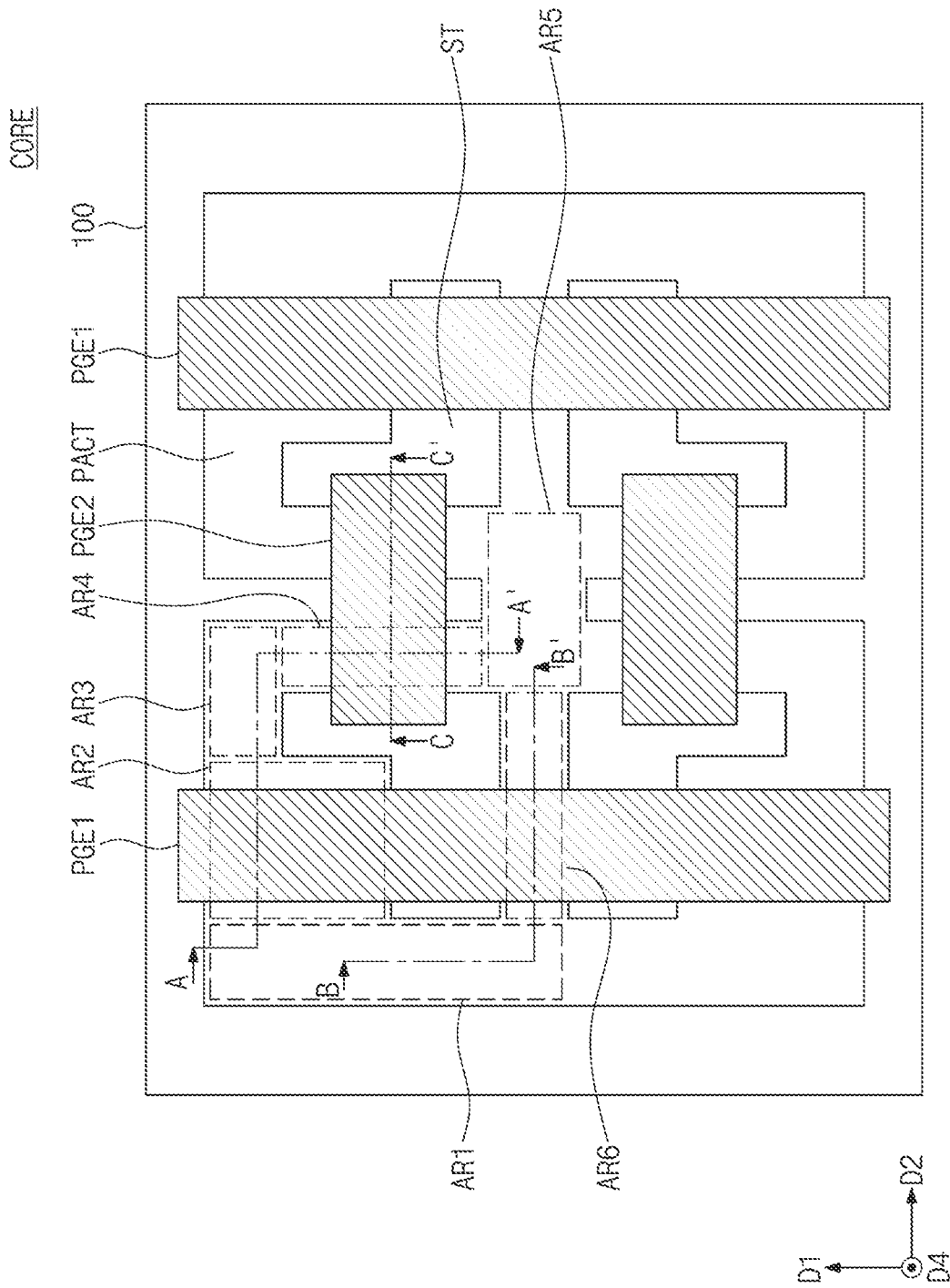
Figure 11A:
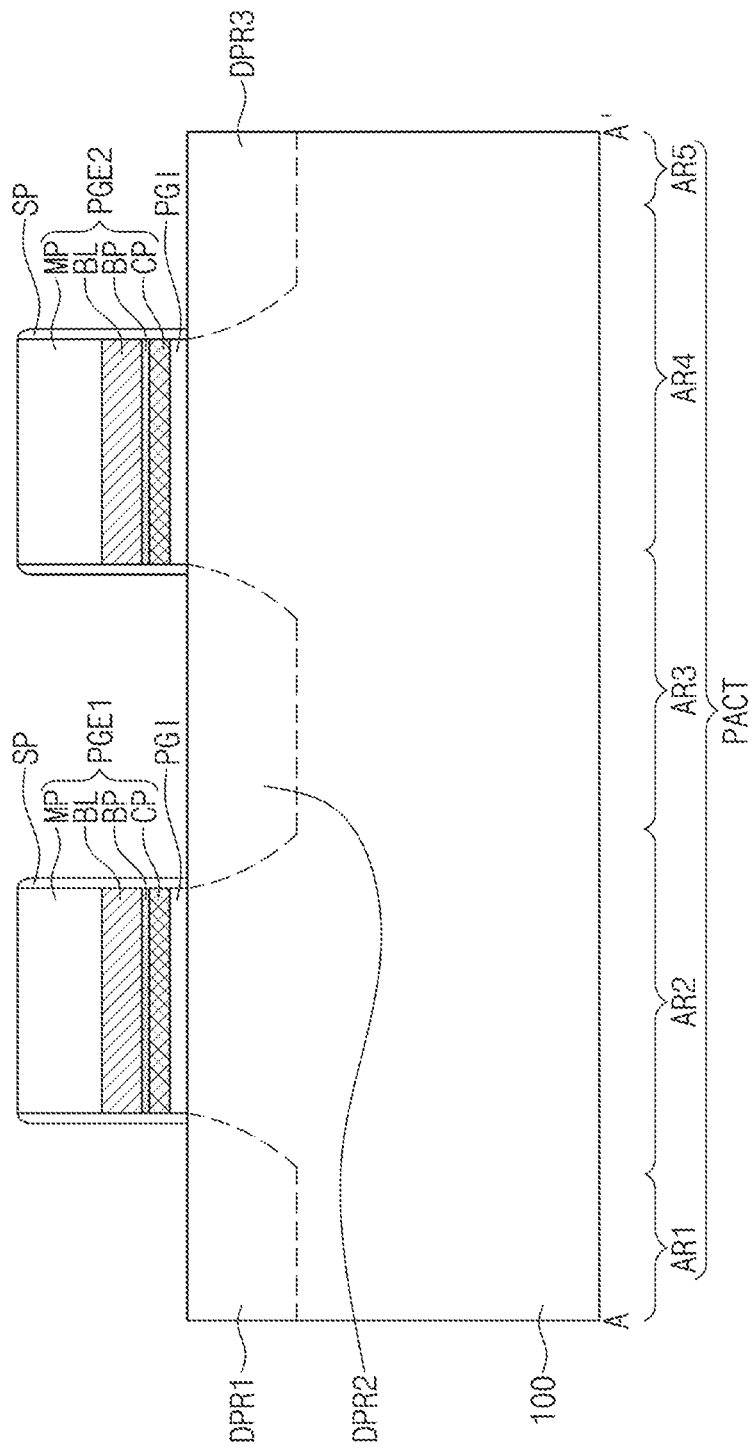
Figure 11B:
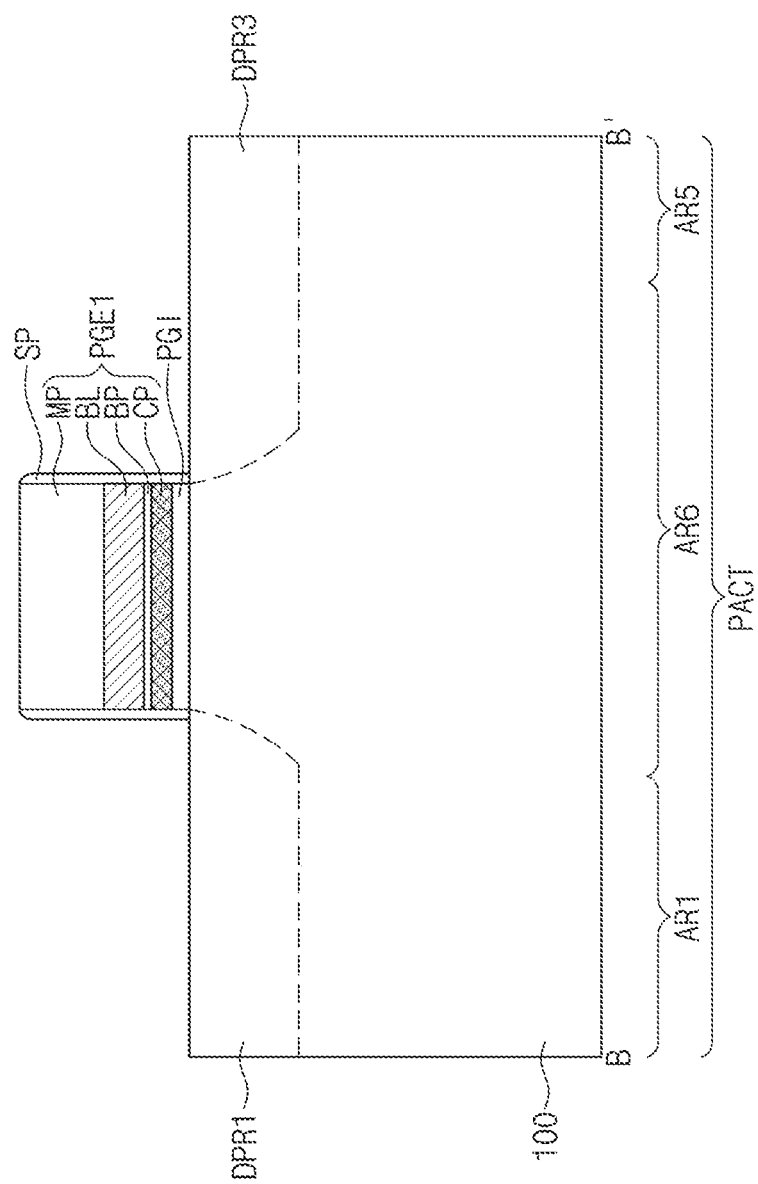
Figure 11C:
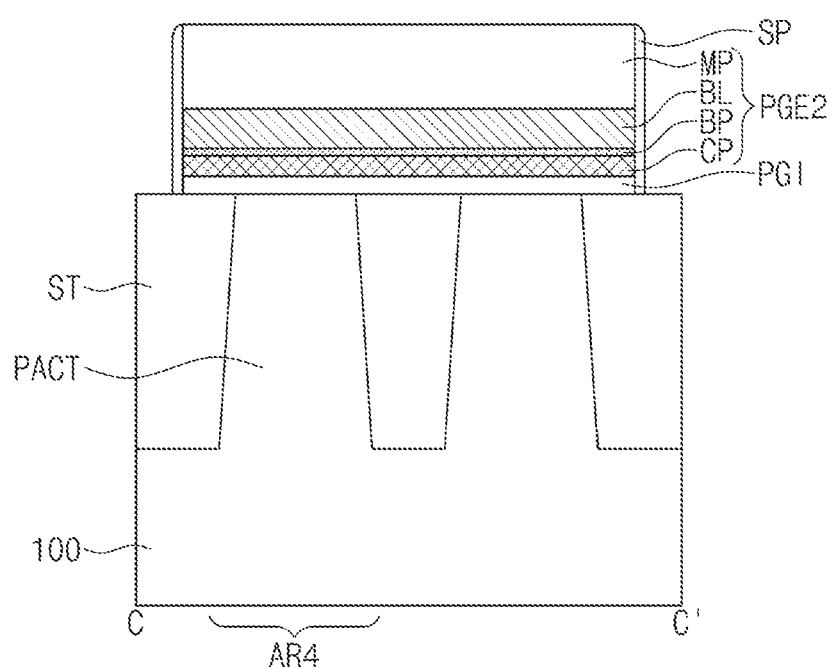
Figure 12:
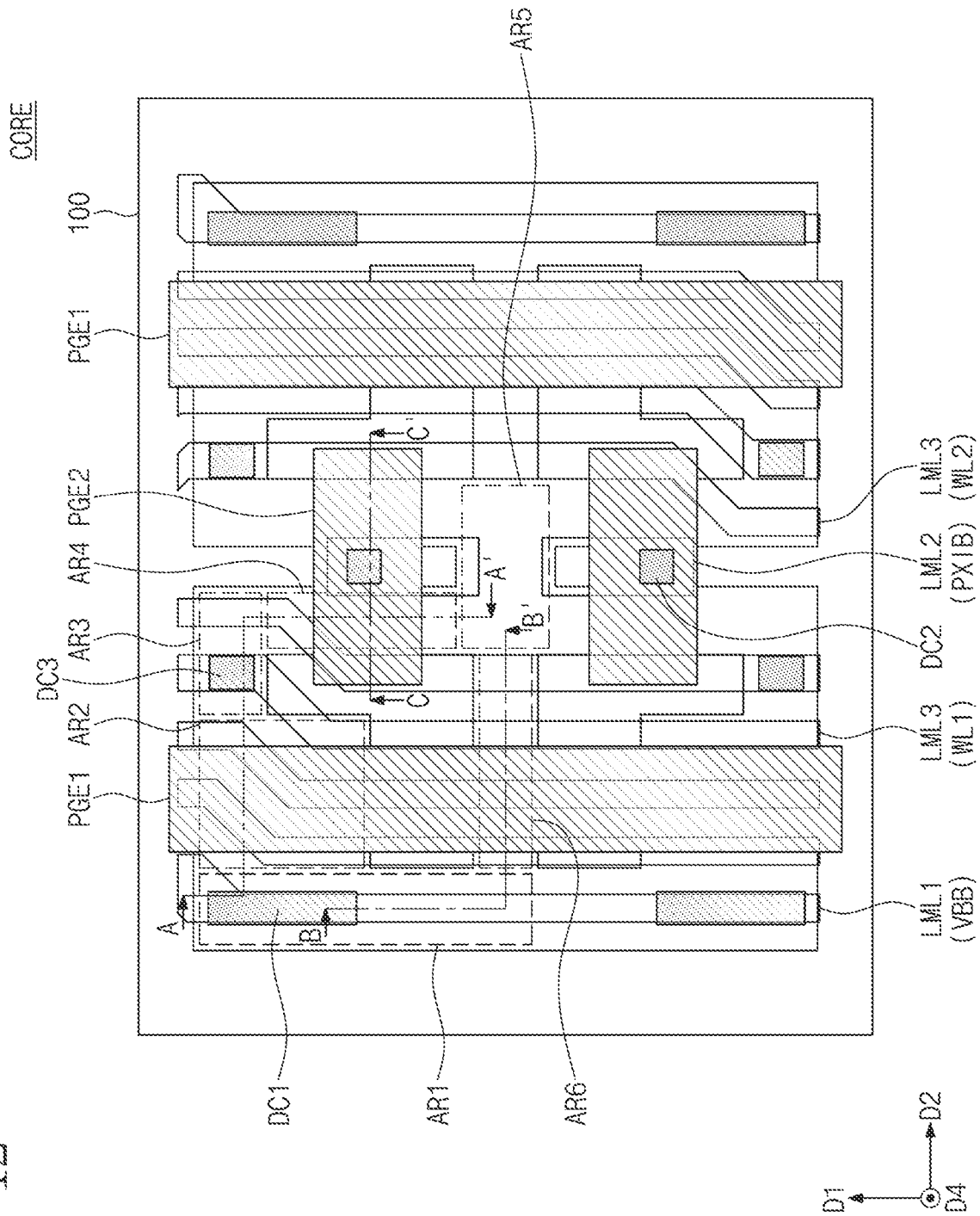
Figure 13A:
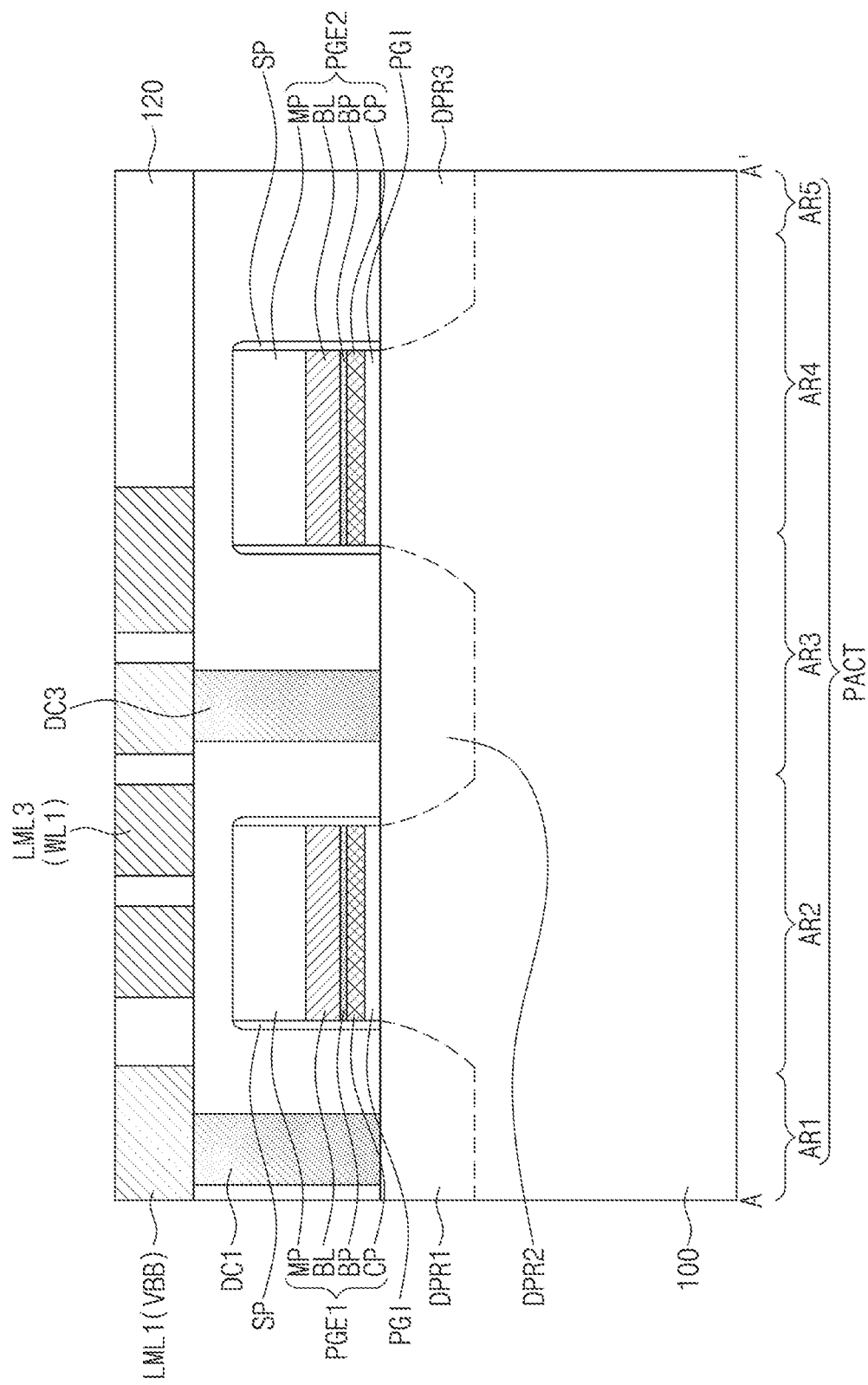
Figure 13B:
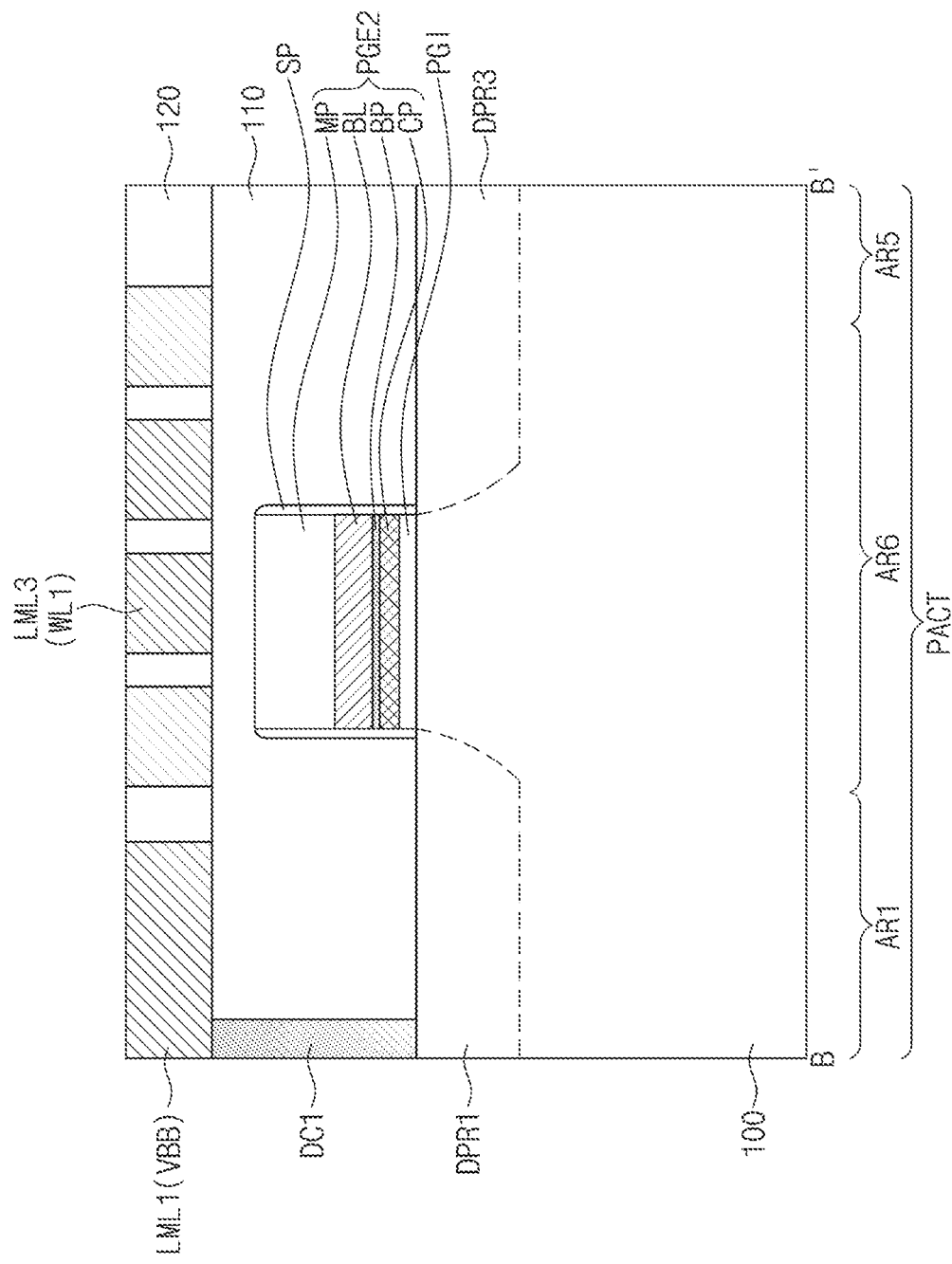
Figure 13C:
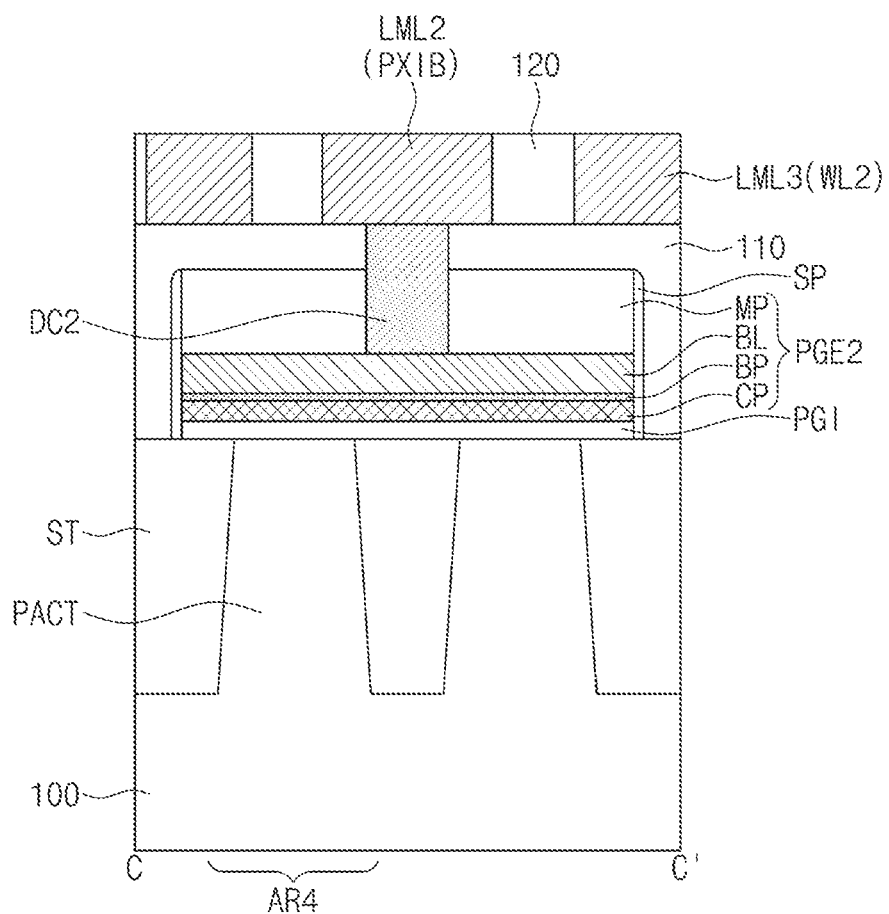

FIGS. 8, 10, and 12 are plan views illustrating a method of fabricating a sub-word-line driver of a semiconductor memory device, according to some embodiments of the inventive concepts. FIGS. 9A, 11A, and 13A are sectional views taken along lines A-A' of FIGS. 8, 10, and 12, respectively. FIGS. 9B, 11B, and 13B are sectional views taken along lines B-B' of FIGS. 8, 10, and 12, respectively. FIGS. 9C, 11C, and 13C are sectional views taken along lines C-C' of FIGS. 8, 10, and 12, respectively.

Referring to FIGS. 8 and 9A to 9C, the device isolation layer ST may be formed on the core/peri region CORE of the substrate 100. In greater detail, the core/peri region CORE of the substrate 100 may be patterned to define the peripheral active region PACT. The device isolation layer ST may be formed on the patterned core/peri region CORE of the substrate 100. A planarization process may be performed on the device isolation layer ST to expose a top surface of the peripheral active region PACT.

The device isolation layer ST may include a first device isolation layer ST1 and a second device isolation layer ST2. The first device isolation layer ST1 may be provided in the peripheral active region PACT and may have an island shape. In some embodiments, the peripheral active region PACT may include the first to sixth regions AR1 to AR6. The first to sixth regions AR1 to AR6 may be arranged around the island-shaped first device isolation layer ST1 in a clockwise direction.

The second device isolation layer ST2 may enclose the peripheral active region PACT. The second device isolation layer ST2 may not be connected to the first device isolation layer ST1 by the peripheral active region PACT and may be spaced apart from the first device isolation layer ST1.

Referring to FIGS. 10 and 11A to 11C, the first and second peripheral gate electrodes PGE1 and PGE2 may be formed on the peripheral active region PACT. The formation of the first and second peripheral gate electrodes PGE1 and PGE2 may include forming the peripheral gate insulating layer PGI on the substrate 100, forming the stacked conductive layers CP, BP, and BL on the peripheral gate insulating layer PGI, forming the mask patterns MP on the stacked conductive layers CP, BP, and BL, and patterning the stacked conductive layers CP, BP, and BL and the peripheral gate insulating layer PGI using the mask patterns MP as an etch mask. A pair of the spacers SP may be formed on opposite side surfaces of each of the first and second peripheral gate electrodes PGE1 and PGE2.

The first peripheral gate electrode PGE1 may be extended in the first direction D1 to cross the sixth region AR6 and the second region AR2. The second peripheral gate electrode PGE2 may be formed on an adjacent pair of the fourth regions AR4 and may have a rectangular shape.

An ion implantation process may be performed on the peripheral active region PACT to form the impurity regions DPR1, DPR2, and DPR3. In greater detail, the first impurity region DPR1 may be formed in the first region AR1 that is exposed between the first and second peripheral gate electrodes PGE1 and PGE2. The second impurity region DPR2 may be formed in the third region AR3 that is exposed between the first and second peripheral gate electrodes PGE1 and PGE2. The third impurity region DPR3 may be formed in the fifth region AR5 that is exposed between the first and second peripheral gate electrodes PGE1 and PGE2.

Referring to FIGS. 12 and 13A to 13C, the first interlayer insulating layer 110 may be formed on the substrate 100 and may cover the first and second peripheral gate electrodes PGE1 and PGE2. The first lower contact DC1 and the third lower contact DC3, which are respectively coupled to the first region AR1 to the third region AR3, may be formed and may penetrate the first interlayer insulating layer 110. The second lower contact DC2, which is coupled to the second peripheral gate electrode PGE2, may be formed and may penetrate the first interlayer insulating layer 110.

The formation of the first to third lower contacts DC1, DC2, and DC3 may include patterning the first interlayer insulating layer 110 to form a first hole that exposes the first region AR1, a second hole that exposes the second peripheral gate electrode PGE2, and a third hole that exposes the third region AR3, and at least partially filling the first to third holes with a metallic material.

The lower interconnection lines LML1, LML2, and LML3 may be formed on the first interlayer insulating layer 110. In some embodiments, the formation of the lower interconnection lines LML1, LML2, and LML3 may include forming a metal layer on the first interlayer insulating layer 110 and patterning the metal layer. The first lower interconnection line LML1 may be formed to be electrically connected to the first lower contact DC1, the second lower interconnection line LML2 may be formed to be electrically connected to the second lower contact DC2, and the third lower interconnection line LML3 may be formed to be electrically connected to the third lower contact DC3.

The second interlayer insulating layer 120 may be formed to cover the lower interconnection lines LML1, LML2, and LML3. A planarization process may be performed on the second interlayer insulating layer 120 to expose top surfaces of the lower interconnection lines LML1, LML2, and LML3.

Referring now to FIGS. 4 and 5A to 5C, the third interlayer insulating layer 130 and the fourth interlayer insulating layer 140 may be sequentially formed on the second interlayer insulating layer 120. The upper contacts MC1 and MC2 may be formed and may penetrate the third and fourth interlayer insulating layers 130 and 140 and may be connected to the lower interconnection lines LML1-LML3. In greater detail, the first upper contact MC1 may be formed to be connected to the first lower interconnection line LML1, and the second upper contact MC2 may be formed to be connected to the second lower interconnection line LML2.

The upper interconnection lines UML1, UML2, and UML3 may be formed on the upper contacts MC1 and MC2. The upper interconnection lines UML1, UML2, and UML3 may be formed in the fourth interlayer insulating layer 140 using a damascene process.

Figure 14:
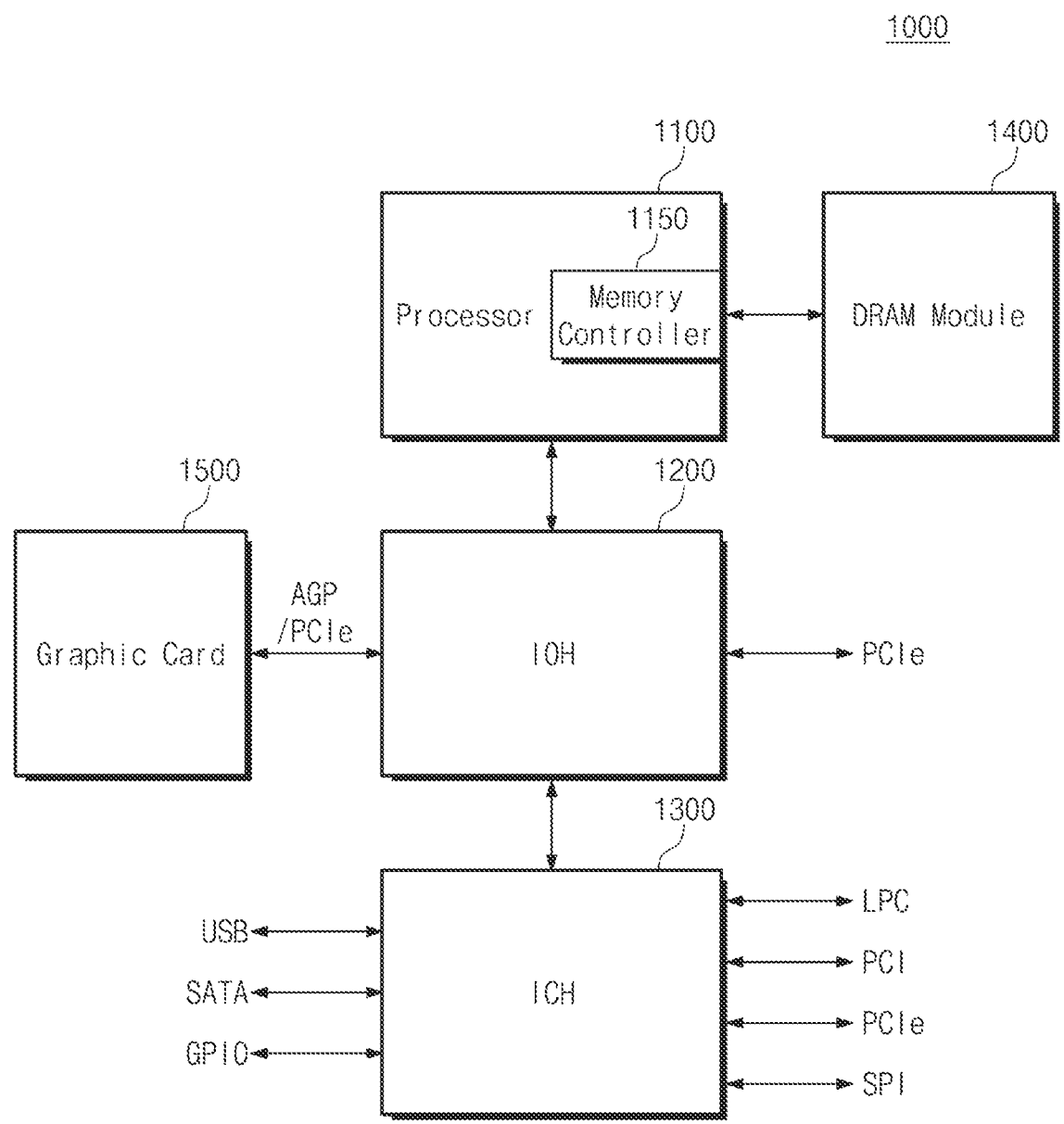
FIG. 14 is a block diagram illustrating a computing system including a semiconductor memory device according to some embodiments of the inventive concepts.

FIG. 14 is a block diagram illustrating a computing system including a semiconductor memory device according to some embodiments of the inventive concepts. Referring to FIG. 14, a computing system 1000 may include a processor 1100, an input/output hub (IOH) 1200, an input/output controller hub (ICH) 1300, at least one DRAM module 1400, and a graphic card 1500. Here, the computing system 1000 may be one of a personal computer (PC), a server computer, a workstation, a laptop computer, a mobile phone, a smart phone, a personal digital assistant (PDA), a portable multimedia player (PMP), a digital camera, a digital TV, a set-top box, a music player, a portable game console, and a navigation system, as non-limiting examples.

The processor 1100 may be configured to execute various computing functions such as specific calculations or tasks. For example, the processor 1100 may be a micro-processor or a central processing unit (CPU). The processor 1100 may include a single processor core or may include a plurality of processor cores. For example, the processor 1100 may have a multi-core structure, such as a dual-core structure, a quad-core structure, a hexa-core structure, or the like. Also, the computing system 1000 is illustrated in FIG. 14 as including one processor 1100, but the computing system 1000 may include a plurality of processors. In some embodiments, the processor 1100 may further include a cache memory that is placed inside or outside the processor 1100.

The processor 1100 may include a memory controller 1150, which is used to control an operation of the DRAM module 1400. The memory controller 1150 included in the processor 1100 may be referred to as an "integrated memory controller (IMC)". A memory interface between the memory controller 1150 and the DRAM module 1400 may be implanted with one channel including a plurality of signal lines or with a plurality of channels. Also, one or more DRAM modules 1400 may be connected with each channel. The memory controller 1150 may be placed within the input/output hub 1200. The input/output hub 1200 including the memory controller 1150 may be referred to as a "memory controller hub (MCH)".

The DRAM module 1400 may include a plurality of semiconductor memory devices (e.g., DRAM devices) which are configured to store data provided from the memory controller 1150. Each of the DRAM devices may include the semiconductor memory device previously described with reference to FIGS. 1 to 7D. That is, each of the DRAM devices may include the cell region CELL shown in FIGS. 6 and 7A to 7D and the core/peri region CORE shown in FIGS. 4 and 5A to 5C.

The input/output hub 1200 may be configured to manage data transmission between the processor 1100 and other devices, such as the graphic card 1500. The input/output hub 1200 may be connected to the processor 1100 through interfaces of various manners. For example, the input/output hub 1200 and the processor 1100 may be connected through various standards of interfaces (e.g., a front side bus (FSB), a system bus, hypertransport, lightning data transport (LDT), quickpath interconnect (QPI), a common system interface (CSI), or the like). The computing system 1000 is illustrated in FIG. 14 as including one input/output hub 1200, but the computing system 1000 may include a plurality of input/output hubs.

The input/output hub 1200 may provide various interfaces for the connection with devices. For example, the input/output hub 1200 may be configured to provide an accelerated graphics port (AGP) interface, peripheral component interface-express (PCIe), a communications streaming architecture (CSA) interface, or the like.

The graphic card 1500 may be connected with the input/output hub 1200 through AGP or PCIe. The graphic card 1500 may be configured to control a display device (not illustrated), which may be used to display an image. The graphic card 1500 may include an internal processor and an internal semiconductor memory device which are used to process an image data. In some embodiments, the input/output hub 1200 may include a graphic card, which is provided in the input/output hub 1200, along with or instead of the graphic card 1500 placed outside the input/output hub 1200. The graphic device included in the input/output hub 2200 may be referred to as "integrated graphics". Also, the input/output hub 1200 including a memory controller and a graphic device may be called a "graphics and memory controller hub (GMCH)".

The input/output controller hub 1300 may be configured to perform a data buffering operation and an interface intervention operation, which may allow for efficient operations of various system interfaces. The input/output controller hub 1300 may be connected to the input/output hub 1200 through an internal bus. For example, the input/output hub 1200 and the input/output controller hub 1300 may be connected to each other through a direct media interface (DMI), a hub interface, an enterprise southbridge interface (ESI), PCIe, or the like.

The input/output controller hub 1300 may be configured to provide various functions for interfacing with peripheral devices. For example, the input/output controller hub 1300 may provide a universal serial bus (USB) port, a serial advanced technology attachment (SATA) port, a general purpose input/output (GPIO), a low pin count (LPC) bus, a serial peripheral interface (SPI), PCI, PCIe, or the like.

In some embodiments, the processor 1100, the input/output hub 1200, and the input/output controller hub 1300 may be implemented with respective chipsets or integrated circuits. Alternatively, two or more elements of the processor 1100, the input/output hub 1200, and the input/output controller hub 1300 may be implemented with a single chipset.

Figure 15:
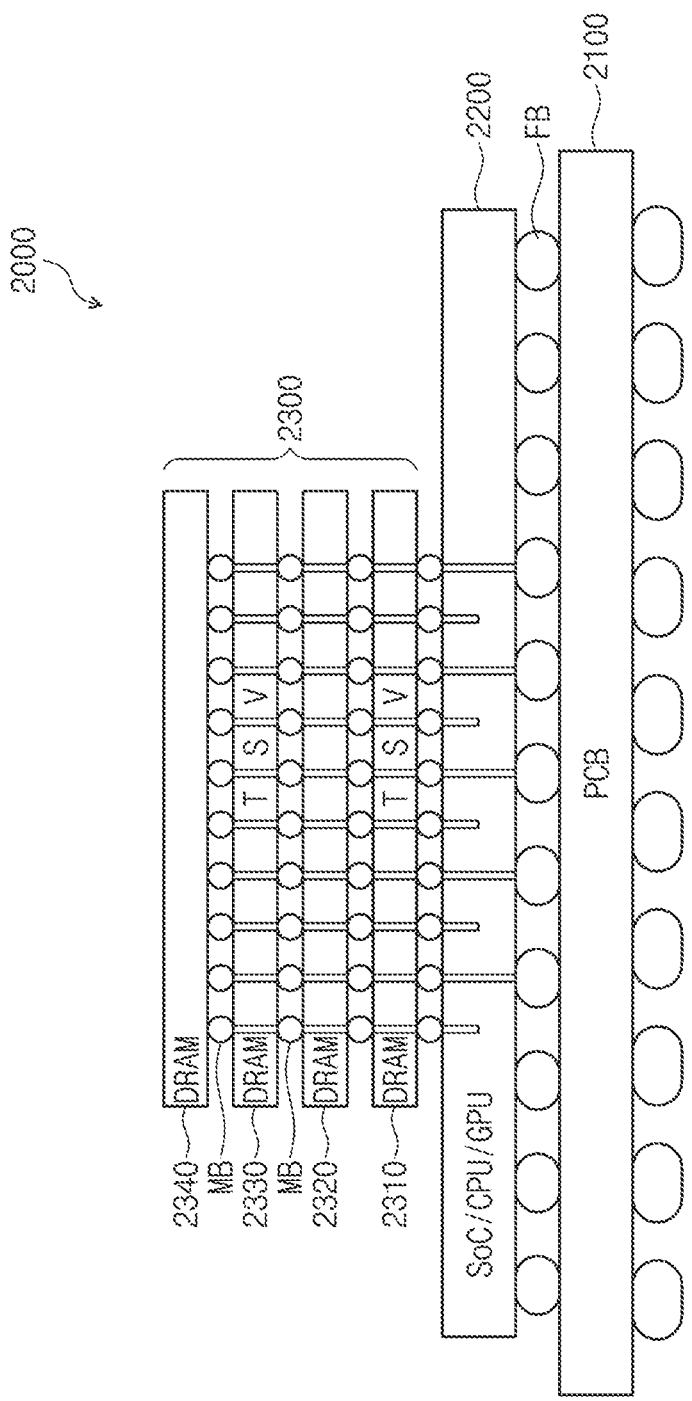
FIG. 15 is a sectional view illustrating a three-dimensional semiconductor package including DRAM devices according to some embodiments of the inventive concepts.

FIG. 15 is a sectional view illustrating a three-dimensional semiconductor package including DRAM devices according to some embodiments of the inventive concepts. Referring to FIG. 15, a three-dimensional semiconductor package 2000 may include a PCB 2100, a host die 2200, and a high bandwidth memory (HBM) 2300. The HBM 2300 may be a three-dimensional semiconductor memory device.

The host die 2200, such as SoC, CPU, or GPU, may be on the PCB 2100 through flip chip bumps FB. A plurality of DRAM dies 2310 to 2340 constituting the HBM 2300 may be stacked on the host die 2200. A buffer die (e.g., a logic die) may be additionally provided on or below the DRAM dies 2310 to 2340. To realize the structure of the HBM 2300, penetration electrodes TSV may be provided to penetrate the DRAM dies 2310 to 2340. The penetration electrodes TSV may be electrically connected to micro-bumps MB, which may be formed between the DRAM dies 2310 to 2340.

In some embodiments, each of the DRAM dies 2310 to 2340 may include the semiconductor memory device previously described with reference to FIGS. 1 to 7D. That is, each of the DRAM dies 2310 to 2340 may include the cell region CELL shown in FIGS. 6 and 7A to 7D and the core/peri region CORE shown in FIGS. 4 and 5A to 5C. In some embodiments, it may be possible to realize the three-dimensional semiconductor package 2000 that includes the HBM 2300 having a high integration density and an improved data reliability property.

Figure 16:
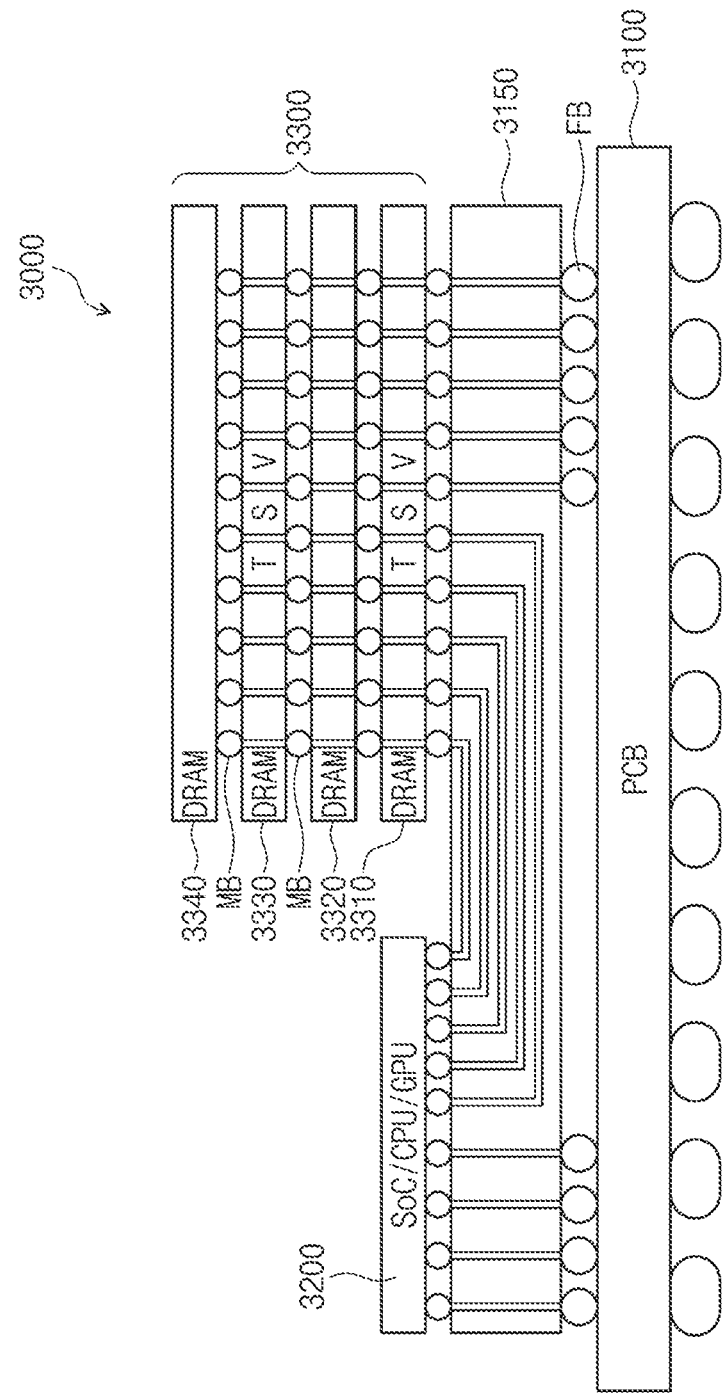
FIG. 16 is a sectional view illustrating a semiconductor package including DRAM devices according to some embodiments of the inventive concepts.

FIG. 16 is a sectional view illustrating a semiconductor package including DRAM devices according to an embodiment of the inventive concept. Referring to FIG. 16, a semiconductor package 3000 may include a PCB 3100, an interposer substrate 3150, a host die 3200, and a HBM 3300.

The HBM 3300 and the host die 3200 may be electrically connected to each other through the interposer substrate 3150. The interposer substrate 3150 may be arranged on the PCB 3100 and may be electrically connected to the PCB 3100 through the flip chip bumps FB.

The host die 3200 and the HBM 3300 may be provided on the interposer substrate 3150. The HBM 3300 may include a plurality of stacked DRAM dies 3310 to 3340. A buffer die (e.g., a logic die) may be additionally provided on or below the DRAM dies 3310 to 3340. To realize the structure of the HBM 3300, the penetration electrodes TSV may be provided to penetrate the DRAM dies 3310 to 3340. The penetration electrodes TSV may be electrically connected to the micro-bumps MB, which may be formed between the DRAM dies 3310 to 3340.

In some embodiments, each of the DRAM dies 3310 to 3340 may include the semiconductor memory device previously described with reference to FIGS. 1 to 7D. In other words, each of the DRAM dies 3310 to 3340 may include the cell region CELL shown in FIGS. 6 and 7A to 7D and the core/peri region CORE shown in FIGS. 4 and 5A to 5C. In some embodiments, it may be possible to realize a semiconductor package that includes the HBM 3300 having a high integration density and high data reliability.

According to some embodiments of the inventive concepts, a VBB voltage may be supplied to a common source region of keeping transistors through an active region, rather than through an additional interconnection line and an additional contact. Accordingly, it may be possible to reduce an area of an active region of a sub-word-line driver and a total chip size and/or increase an integration density of a chip. Furthermore, by increasing a pitch between interconnection lines, it may be possible to increase a degree of freedom in constructing a routing structure, to reduce a process defect in a fabrication process, to suppress an interference issue between the interconnection lines, and/or to improve reliability and electric characteristics of a semiconductor memory device.

While some examples of embodiments of the inventive concepts have been particularly shown and described, it will be understood by one of ordinary skill in the art that variations in form and detail may be made therein without departing from the scope of the attached claims.

What is claimed is:

1. A sub-word-line driver comprising a word line pull-up transistor, a word line pull-down transistor, and a keeping transistor configured to maintain a word line at a specified voltage level,
   wherein the sub-word-line driver comprises:
   a peripheral active region on a substrate, the peripheral active region comprising first to sixth regions, which are arranged around a first device isolation layer of an island shape in a clockwise direction and are connected to each other;
   a first peripheral gate electrode that corresponds to a gate node of the word line pull-down transistor on the peripheral active region and crossing the second region and the sixth region;
   a second peripheral gate electrode that corresponds to a gate node of the keeping transistor on the peripheral active region and crossing the fourth region; and
   a first lower contact coupled to the first region,
   wherein the first region corresponds to a source node of the word line pull-down transistor and is configured to be supplied with a first voltage through the first lower contact,
   wherein the fifth region corresponds to a source node of the keeping transistor,
   wherein the sixth region extends from the first region to the fifth region and is below the first peripheral gate electrode, and
   wherein the sixth region connects the first region to the fifth region and is configured to supply the first voltage from the first region to the fifth region.

2. The sub-word-line driver of claim 1, further comprising a second device isolation layer, which is provided on the substrate and surrounds the peripheral active region,
   wherein the first device isolation layer is spaced apart from the second device isolation layer with the peripheral active region interposed therebetween.

3. The sub-word-line driver of claim 1, further comprising:
   a second lower contact coupled to the second peripheral gate electrode;
   a third lower contact coupled to the third region;
   a first lower interconnection line on the first lower contact and electrically connected to the first lower contact;
   a second lower interconnection line on the second lower contact and electrically connected to the second lower contact; and
   a third lower interconnection line on the third lower contact and electrically connected to the third lower contact,
   wherein the first and third lower interconnection lines have a line shape that extend in a first direction, and
   the second lower interconnection line has a pad shape.

4. The sub-word-line driver of claim 3, wherein the first lower interconnection line is configured to be supplied with the first voltage,
   the second lower interconnection line is configured to be supplied with a driving signal of the sub-word-line driver, and
   the third lower interconnection line is the word line.

5. The sub-word-line driver of claim 3, further comprising a first upper interconnection line and a second upper interconnection line provided on the first to third lower interconnection lines,
   wherein the first and second upper interconnection lines have a line shape that extends in a second direction,
   wherein the first upper interconnection line is electrically connected to the first lower interconnection line through a first upper contact, and
   wherein the second upper interconnection line is electrically connected to the second lower interconnection line through a second upper contact.

6. The sub-word-line driver of claim 1, wherein the first region, the fifth region, the sixth region, and the first peripheral gate electrode form a parasitic transistor of the sub-word-line driver, and
   wherein an electric connection between the first region and the fifth region is controlled by an operation of the parasitic transistor.

7. The sub-word-line driver of claim 6, wherein the third region corresponds to a common drain node of the word line pull-down transistor and the keeping transistor, and
   the third region is electrically connected to the word line.

8. The sub-word-line driver of claim 1, wherein the fifth region is not provided with a contact coupled thereto.

9. The sub-word-line driver of claim 1, wherein the sub-word-line driver is configured to drive a word line of a dynamic random access memory (DRAM) cell on the substrate.

10. The sub-word-line driver of claim 1, wherein each of the first and second peripheral gate electrodes comprises a doped semiconductor layer, a metal barrier layer, and a metal layer, which are sequentially stacked on the substrate.

11. A semiconductor memory device, comprising a first sub-word-line driver,
    wherein the first sub-word-line driver comprises a first pull-up transistor, a first pull-down transistor, a first keeping transistor, and a first parasitic transistor,
    wherein a first impurity region of the first pull-down transistor is connected to a second impurity region of the first keeping transistor through the first parasitic transistor,
    wherein a gate electrode of the first pull-down transistor is connected to a gate electrode of the first parasitic transistor, and
    wherein a first voltage, which is supplied to the first impurity region, is supplied also to the second impurity region through the first parasitic transistor.

12. The semiconductor memory device of claim 11, further comprising a second sub-word-line driver,
    wherein the second sub-word-line driver comprises a second pull-up transistor, a second pull-down transistor, a second keeping transistor, and a second parasitic transistor,
    wherein the second keeping transistor is configured to share the second impurity region of the first keeping transistor, wherein a third impurity region of the second pull-down transistor is connected to the second impurity region through the second parasitic transistor, and wherein the first voltage, which is supplied to the third impurity region, is supplied also to the second impurity region through the second parasitic transistor.

13. The semiconductor memory device of claim 11, wherein an active region of the first pull-down transistor, an active region of the first keeping transistor, and an active region of the first parasitic transistor are connected to each other to form a peripheral active region, wherein a device isolation layer of an island shape is in a center portion of the peripheral active region, and wherein the peripheral active region surrounds the device isolation layer.

14. The semiconductor memory device of claim 11, wherein the first sub-word-line driver further comprises a lower contact configured to supply the first voltage to the first impurity region.

15. The semiconductor memory device of claim 14, wherein the lower contact is spaced apart from the second impurity region.

16. A semiconductor memory device, comprising:
a first sub-word-line driver including a first pull-up transistor, a first pull-down transistor, a first keeping transistor, and a first parasitic transistor; and
a second sub-word-line driver including a second pull-up transistor, a second pull-down transistor, a second keeping transistor, and a second parasitic transistor,
wherein the first and second keeping transistors share a common source region,
wherein each of the first and second pull-down transistors comprises an impurity region configured to be supplied with a first voltage,
wherein the first parasitic transistor connects the impurity region of the first pull-down transistor to the common source region, and wherein the second parasitic transistor connects the impurity region of the second pull-down transistor to the common source region.

17. The semiconductor memory device of claim 16, wherein an active region of the first pull-down transistor, an active region of the first keeping transistor, and an active region of the first parasitic transistor are connected to each other to constitute a peripheral active region, wherein a device isolation layer of an island shape is in a center portion of the peripheral active region, and wherein the peripheral active region surrounds the device isolation layer.

18. The semiconductor memory device of claim 16, wherein the first sub-word-line driver further comprises a first lower contact configured to supply the first voltage to the impurity region of the first pull-down transistor, and wherein the second sub-word-line driver further comprises a second lower contact configured to supply the first voltage to the impurity region of the second pull-down transistor.

19. The semiconductor memory device of claim 18, wherein the first and second lower contacts are spaced apart from the common source region.

20. The semiconductor memory device of claim 16, further comprising:
a third sub-word-line driver including a third pull-down transistor, a third keeping transistor, and a third parasitic transistor; and
a fourth sub-word-line driver including a fourth pull-down transistor, a fourth keeping transistor, and a fourth parasitic transistor,
wherein the third and fourth keeping transistors share the common source region, and
wherein at least one of the first to fourth parasitic transistors is configured to supply the first voltage to the common source region.

* * * * *